United States Patent
Shinozaki et al.

(10) Patent No.: US 7,982,314 B2
(45) Date of Patent: Jul. 19, 2011

(54) SEMICONDUCTOR INTEGRATED CIRCUIT DEVICE

(75) Inventors: Masao Shinozaki, Higashimurayama (JP); Kenji Nishimoto, Saitama (JP); Takashi Akioka, Kokubunji (JP); Yutaka Kohara, Annaka (JP); Sanae Asari, Kofu (JP); Shusaku Miyata, Kokubunji (JP); Shinji Nakazato, Maebashi (JP)

(73) Assignees: Renesas Electronics Corporation, Kanagawa (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 12/805,261

(22) Filed: Jul. 21, 2010

(65) Prior Publication Data

US 2010/0308458 A1    Dec. 9, 2010

Related U.S. Application Data

(60) Continuation of application No. 12/453,383, filed on May 8, 2009, now Pat. No. 7,808,107, which is a division of application No. 11/202,352, filed on Aug. 12, 2005, now Pat. No. 7,547,971, which is a continuation of application No. 10/362,661, filed as application No. PCT/JP01/11039 on Dec. 17, 2001, now Pat. No. 6,963,136.

(30) Foreign Application Priority Data

Dec. 18, 2000  (JP) ................................ 2000-383728
May 30, 2001  (JP) ................................ 2001-161630

(51) Int. Cl.
    *H01L 23/48* (2006.01)
(52) U.S. Cl. ........................ 257/758; 257/759

(58) Field of Classification Search .................. 257/758, 257/759
See application file for complete search history.

(56) References Cited

U.S. PATENT DOCUMENTS

| | | |
|---|---|---|
| 4,508,749 A | 4/1985 | Brannon et al. |
| 4,916,520 A | 4/1990 | Kurashima |
| 5,309,015 A | 5/1994 | Kuwata et al. |
| 5,547,740 A | 8/1996 | Higdon et al. |
| 5,593,926 A | 1/1997 | Fujihira |
| 5,892,288 A | 4/1999 | Muraki et al. |
| 5,994,766 A | 11/1999 | Shenoy et al. |
| 6,030,890 A | 2/2000 | Iwabuchi |
| 6,177,731 B1 | 1/2001 | Ishida et al. |

(Continued)

FOREIGN PATENT DOCUMENTS

DE    196 10 302 A1    10/1996

(Continued)

OTHER PUBLICATIONS

International Search Report from the Japanese Patent Office dated Mar. 19, 2002 for PCT/JP01/11039.

(Continued)

*Primary Examiner* — Douglas M Menz
(74) *Attorney, Agent, or Firm* — Stites & Harbison PLLC; Juan Carlos A. Marquez, Esq.

(57) ABSTRACT

Circuit elements and wirings constituting a circuit, and first electrodes electrically connected to such a circuit are provided on one main surface of a semiconductor substrate. An organic insulating film is formed on the circuit except for openings on the surfaces of the first electrodes. First and second external connecting electrodes are provided on the organic insulating film. At least one conductive layer for electrically connecting the first and second external connecting electrodes and the first electrodes is placed on the organic insulating film.

18 Claims, 24 Drawing Sheets

U.S. PATENT DOCUMENTS

| | | |
|---|---|---|
| 6,266,283 B1 | 7/2001 | Fujimori |
| 6,452,256 B1 | 9/2002 | Kazama et al. |
| 6,498,396 B1 | 12/2002 | Arimoto |
| 6,680,992 B1 | 1/2004 | Morikawa et al. |

FOREIGN PATENT DOCUMENTS

| | | |
|---|---|---|
| JP | 5-136125 | 6/1993 |
| JP | 05-218042 | 8/1993 |
| JP | 8-31982 | 2/1996 |
| JP | 08-237091 | 9/1996 |
| JP | 08-250498 | 9/1996 |
| JP | 9-107048 | 4/1997 |
| JP | 10-335567 | 12/1998 |
| JP | 2000-195263 | 7/2000 |
| JP | 2000-252418 | 9/2000 |
| JP | 2001-156209 | 6/2001 |
| JP | 2001-257310 | 9/2001 |
| JP | 2002-57292 | 2/2002 |

OTHER PUBLICATIONS

The Office Action issued by the Patent Office of the People's Republic of China dated May 30, 2008 regarding Application No. 01815004.7 in Chinese +.

Notification of Reasons for Refusal issued by the Japanese Patent Office on Feb. 23, 2011 in the corresponding Japanese Patent Application No. 2007-203747 (3 pages) with an English language translation (5 pages).

FIG. 11
(A)
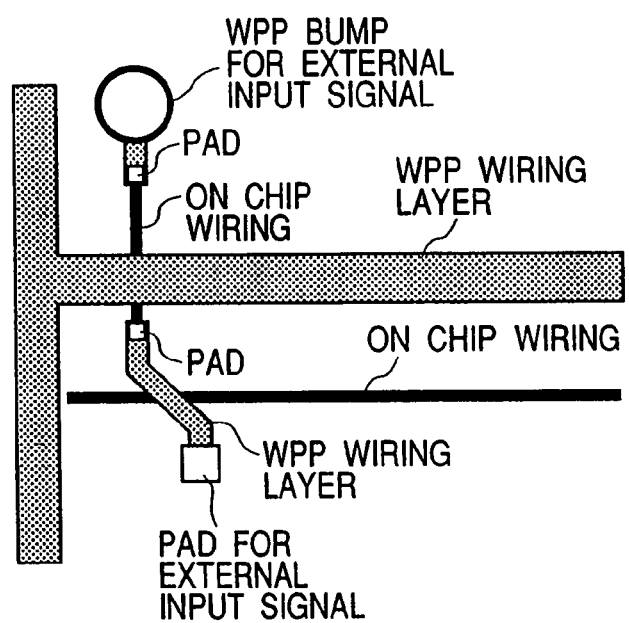
(B)
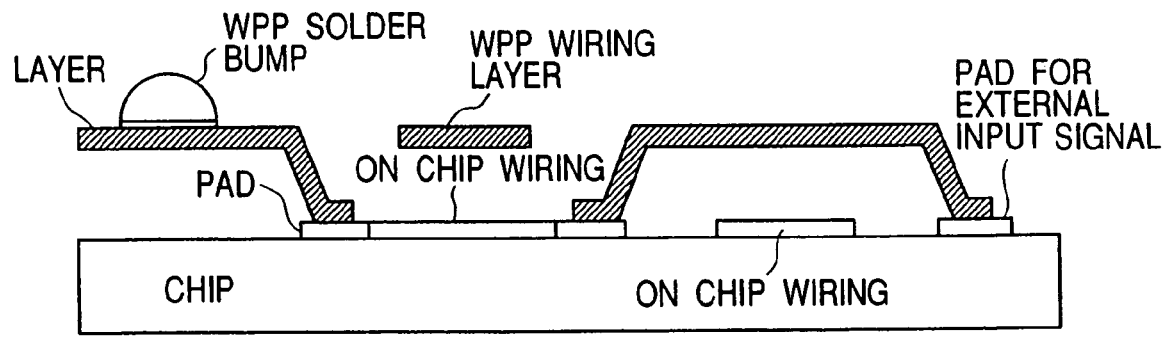

FIG. 18
(A)
(B)
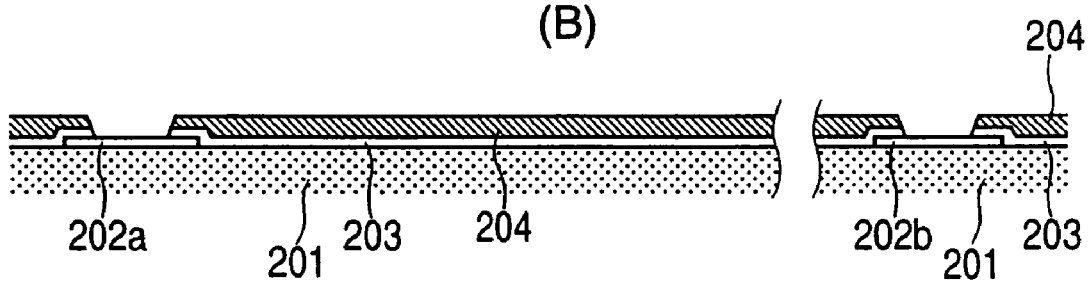
(C)
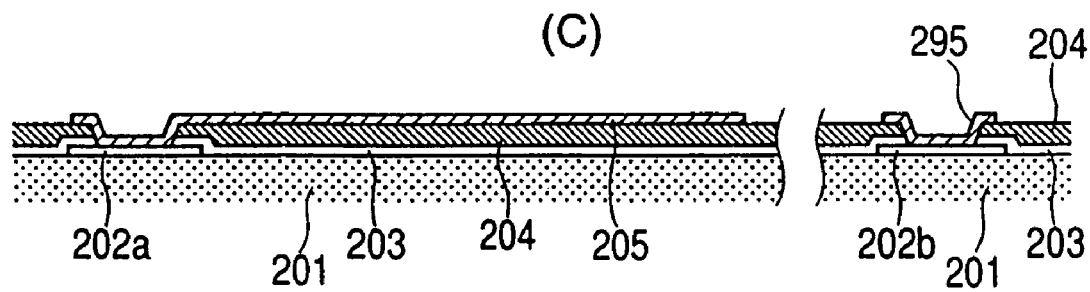
(D)
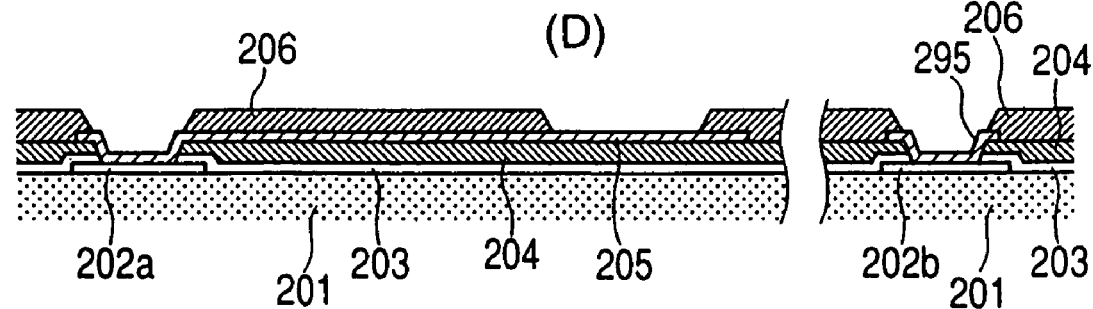

FIG. 19
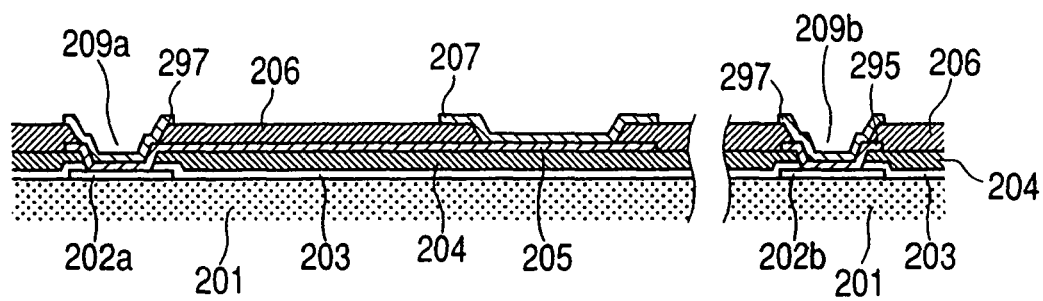
(E)
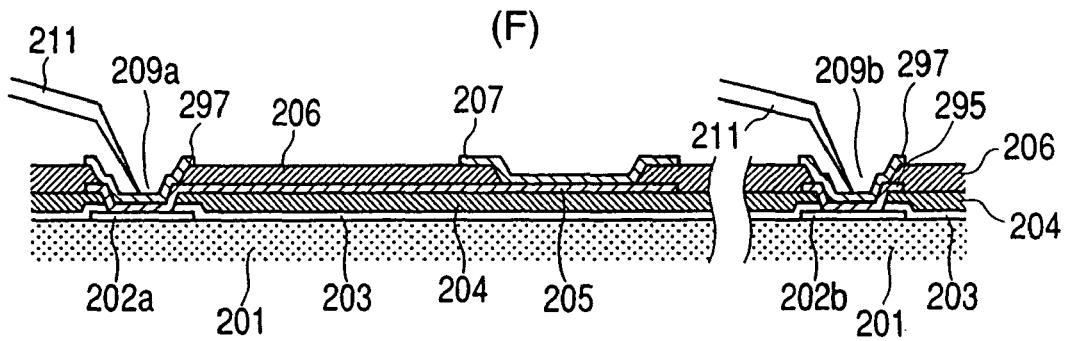
(F)
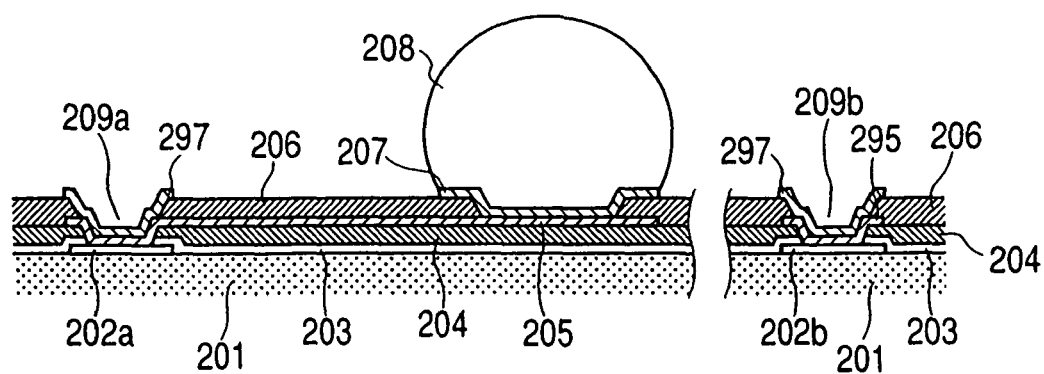
(G)

CONVENTIONAL COMPLETED WAFER

FIG. 23
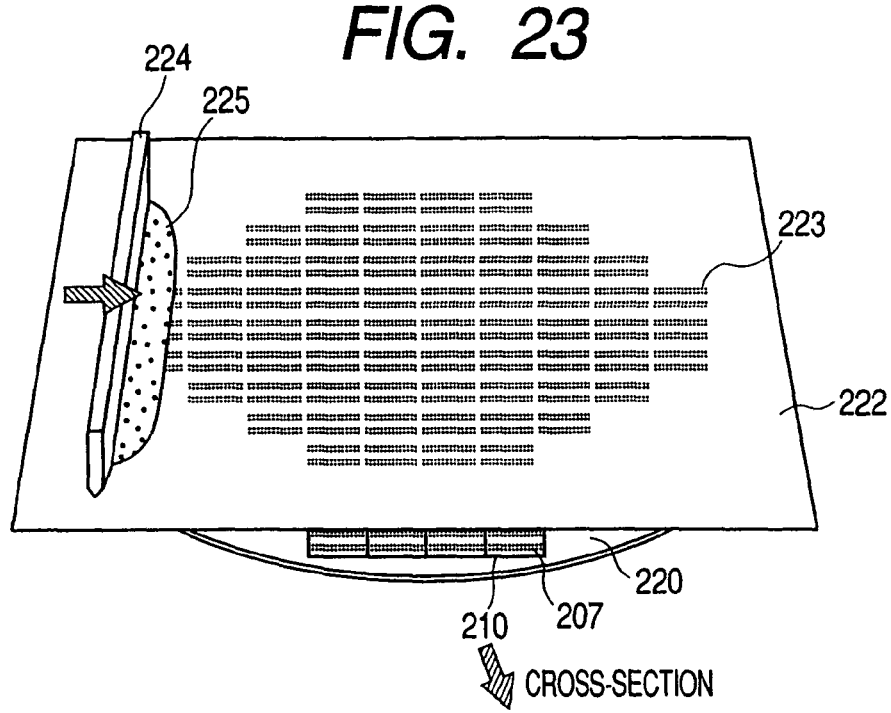
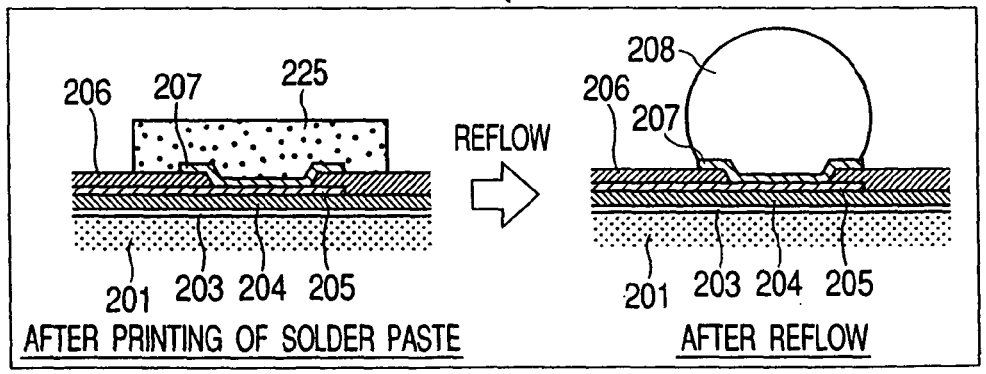
FIG. 24
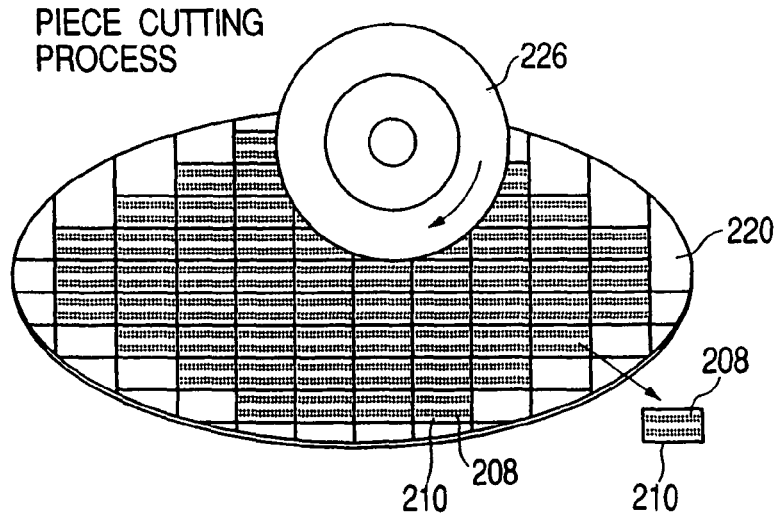

SEMICONDUCTOR INTEGRATED CIRCUIT DEVICE

This application is a Continuation of nonprovisional U.S. application Ser. No. 12/453,383 filed May 8, 2009, now U.S. Pat. No. 7,808,107 which is a Divisional of nonprovisional U.S. application Ser. No. 11/202,352 filed Aug. 12, 2005, now U.S. Pat. No. 7,547,971 which is a Continuation of nonprovisional U.S. application Ser. No. 10/362,661 filed Jun. 19, 2003, now U.S. Pat. No. 6,963,136 which was the US National Stage of PCT Application No. PCT/JP01/11039, which has an International Filing Date of Dec. 17, 2001. Priority is claimed based on U.S. application Ser. No. 12/453,383 filed May 8, 2009, which claims the priority of U.S. application Ser. No. 11/202,352 filed Aug. 12, 2005, which claims the priority of U.S. application Ser. No. 10/362,661 filed Jun. 19, 2003 which claims the priority of PCT Application No. PCT/JP01/11039 filed Dec. 17, 2001, which claims the priority of Japanese applications 2000-383728 and 2001-161630 filed on Dec. 18, 2000, and May 30, 2001, respectively, all of which are incorporated by reference.

BACKGROUND OF THE INVENTION

1. Technical Field

The present invention relates to a semiconductor integrated circuit device, and particularly to a technology effective for application to a device wherein protruded electrodes such as solder bumps or the like for board packaging are formed on a semiconductor substrate.

2. Background Art

As semiconductor integrated circuit devices (hereinafter called simply "flip-chip semiconductor integrated circuit devices") wherein protruded electrodes such as solder bumps or the like are formed, there are known Unexamined Patent Publication No. Hei 5 (1993)-218042, Unexamined Patent Publication No. Hei 8 (1996)-250498, and U.S. Pat. No. 5,547,740. Each of these Publications shows one basic form of the flip-chip semiconductor integrated circuit device.

In the flip-chip semiconductor integrated circuit device described in each of the above Publications, rewirings are routed from bonding pads of a chip thereof, for example, and bump electrodes connected to the rewirings are placed on the surface of the chip in an array (area array) form. The bump electrodes disposed in such an area array form are exposed from a surface protective film. It is thus possible to enlarge the interval between the adjacent bump electrodes and facilitate the board packaging that bump electrodes are connected to wirings on a printed circuit board. Further, a low-cost printed circuit board wide in wiring interval can be utilized. In such a flip-chip semiconductor integrated circuit device, the bump electrodes are terminals directly connected to the printed circuit board. Only the bump electrodes are exposed and the bonding pads of the semiconductor chip are covered with an insulating film or a protective film. Therefore, the bump electrodes correspond to external connecting terminals such as lead pins of a package such as a QFP or the like.

In the above-described flip-chip semiconductor integrated circuit device, there is a tendency to more and more increase the scale of each internal circuit for the purpose of improvements in function. Whilst the size of one semiconductor chip is made large with the increase in circuit scale, a circuit's wiring width becomes small. Therefore, for example, in a clock-operated semiconductor integrated circuit device, a signal delay is developed while a clock supplied from an external terminal is being transmitted through an internal wiring. A skew occurs between clocks supplied to individual internal circuits and a timing margin for accommodating it is required, thus interfering with the transition of the clock to a high frequency. A problem arises in that when a source voltage is stepped down in association with low power consumption, device micro-fabrication, etc. and set as an operating voltage for each internal circuit, it is necessary to provide a plurality of step down voltage generators for the purpose of preventing a voltage loss in the internal wiring, and hence current consumption at such step down circuit units will increase and a circuit scale will increase.

An object of the present invention is to provide a semiconductor integrated circuit device capable of speeding up its operation and enabling circuit's rational arrangements. Another object of the present invention is to provide a semiconductor integrated circuit device capable of enhancing the degree of freedom of the layout of circuits lying within a chip in a simple configuration. The above, other objects, and novel features of the present invention will become apparent from the description of the present specification and the accompanying drawings.

DISCLOSURE OF THE INVENTION

A summary of a typical one of the inventions disclosed in the present application will be described in brief as follows: Circuit elements and wirings constituting a circuit, and first electrodes electrically connected to such a circuit are provided on one main surface of a semiconductor substrate. An organic insulating film is formed on the circuit except for openings on the surfaces of the first electrodes. First and second external connecting electrodes are provided on the organic insulating film, and a conductive layer for electrically connecting the first and second external connecting electrodes and the first electrode is mounted onto the organic insulating film.

A summary of another typical one of the inventions disclosed in the present application will be described in brief as follows: Circuit elements and wirings constituting a circuit, and first and second electrodes electrically connected to such a circuit are provided on one main surface of a semiconductor substrate. An organic insulating film is formed on the circuit except for openings on the surfaces of the first and second electrodes, and a conductive layer for electrically connecting the first and second electrodes is placed on the organic insulating film.

BRIEF DESCRIPTION OF THE DRAWINGS

FIGS. 11(A) and 11(B) are schematic configurational views showing a further embodiment of a semiconductor integrated circuit device according to the present invention;

FIGS. 18(A) to 18(D) are cross-sectional views of the device structure, for describing some of one embodiment of a method of manufacturing rewirings for a semiconductor integrated circuit device according to the present invention;

FIGS. 19(E) to 19(G) are cross-sectional views of the device structure, for describing the remaining part of one embodiment of the method of manufacturing the rewirings for the semiconductor integrated circuit device according to the present invention;

FIG. 23 is a perspective view at a still further step, for describing the manufacturing process of the flip-chip semiconductor integrated circuit device according to the present invention;

FIG. 24 is a perspective view at a still further step, for describing the manufacturing process of the flip-chip semiconductor integrated circuit device according to the present invention;

BEST MODE FOR CARRYING OUT THE INVENTION

Figure 1:
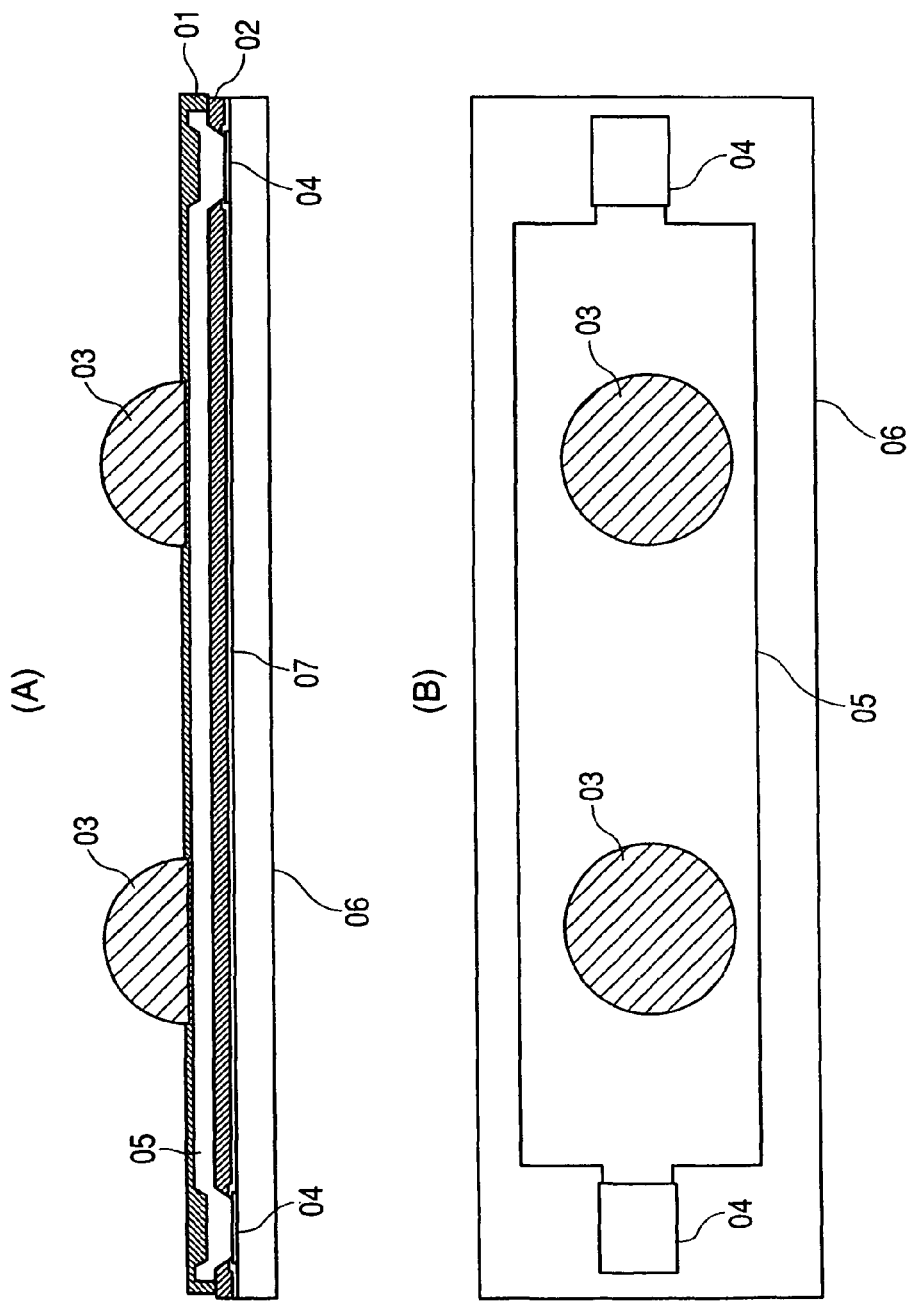
FIGS. 1(A) and 1(B) are schematic configurational views showing one embodiment of a semiconductor integrated circuit device according to the present invention.

Preferred embodiments of the present invention will hereinafter be described in detail with reference to the accompanying drawings.

FIGS. 1(A) and 1(B) are schematic configurational views showing one embodiment of a semiconductor integrated circuit device according to the present invention. A sectional portion is shown in FIG. 1(A), and a plan portion is shown in FIG. 1(B), respectively. In the semiconductor integrated circuit device showing the present embodiment, unillustrated circuit elements and wirings are formed on one main surface side of a semiconductor chip 06. Pads 04 are formed of the top-layer wiring of these wirings. An organic insulating film 02 corresponding to a first layer is formed except for openings for the pads 04. Although not restricted in particular, the organic insulating film 02 is formed of polyimide.

A rewiring layer 05 used as a conductive layer, which electrically connects between at least two pads 04 formed on the main surface side of the semiconductor chip 06, is formed on the organic insulating film corresponding to the first layer formed of the polyimide. An organic insulating film 01 corresponding to a second layer is formed except for openings in which bump electrodes 03 are formed within the surface of the rewiring layer 05. The bump electrodes are provided at least two with respect to one rewiring layer 05.

The rewiring layer 05 employed in the present embodiment is not intended for substitution for lead pins of a general IC package by simply routing rewirings from bonding pads of a semiconductor chip to increase intervals between adjacent bump electrodes and connecting the bump electrodes to wirings on a printed circuit board. The rewiring layer 05 is intended to act as a wiring that interconnects between the two bump electrodes 03 and is connected to two pads (bonding pads) provided on a semiconductor chip. The configuration of such a rewiring layer 05 becomes beneficial as power supply means to be next described.

Although not restricted in particular, a top wiring layer 07 for connecting the two pads 04 is formed on the main surface of the semiconductor chip 06. The circuit elements formed on the main surface side of the semiconductor chip 06, for example, are supplied with operating voltages such as a source voltage, etc. through the use of the top wiring layer 07.

Figure 2:
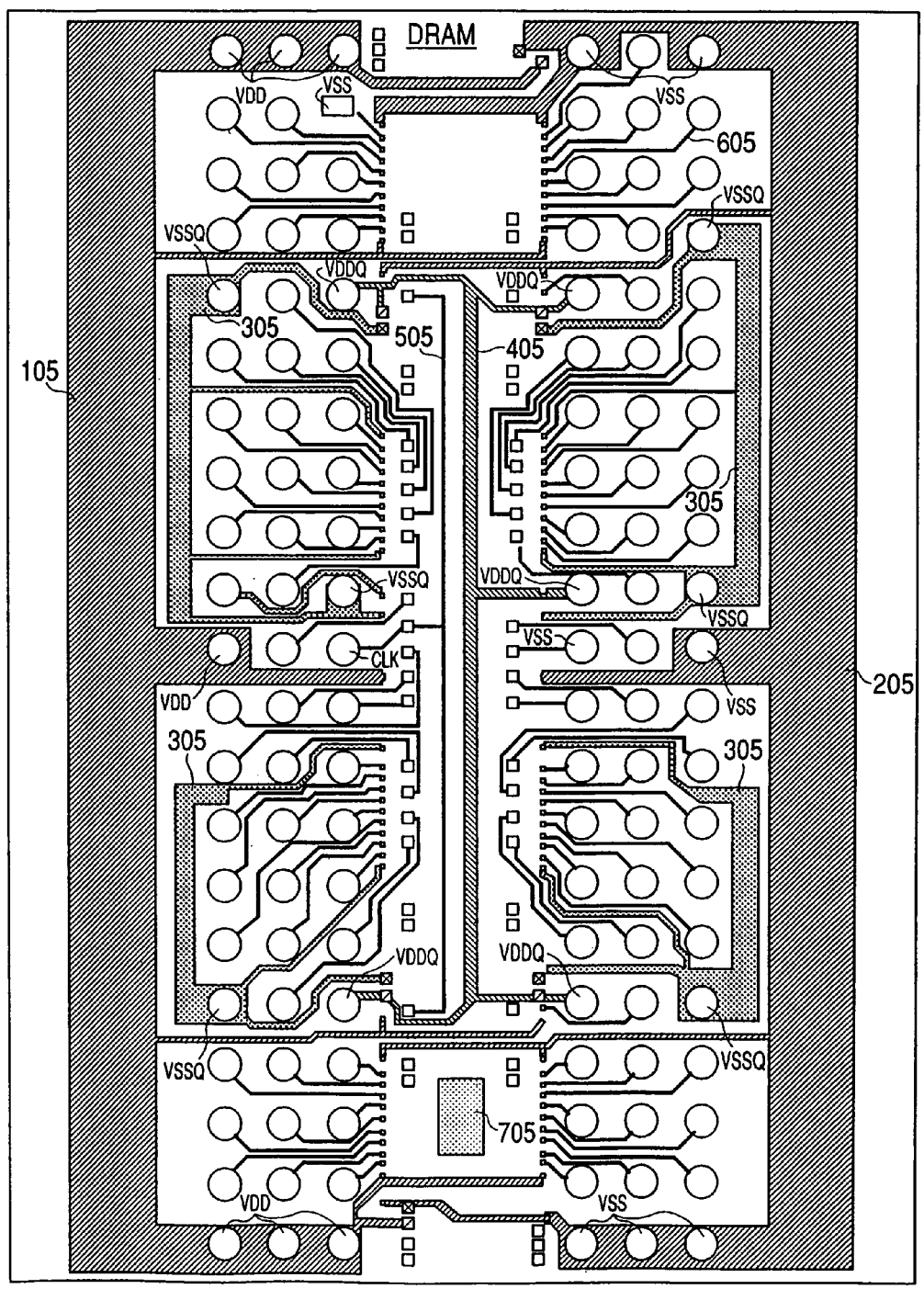
FIG. 2 is a plan view showing one embodiment of the semiconductor integrated circuit device according to the present invention.

A plan view of one embodiment of a semiconductor integrated circuit device according to the present invention is shown in FIG. 2. Although not restricted in particular, the semiconductor integrated circuit device showing the present embodiment is intended for a dynamic RAM (Random Access Memory). A layout of rewirings, and bump electrodes and pads connected thereto is shown therein.

In the same drawing, the bump electrodes are respectively indicated by ○ and the pads are respectively indicated by small □. These bump electrodes and pads are interconnected with each other by their corresponding rewirings. The rewirings 05 are divided into two types for a DC voltage and an AC signal according to the functions thereof. One wiring layer 605 illustratively shown is identical to the rewiring employed in the conventional wafer/level CSP (chip size package) and connects one bump electrode and one pad to each other in a one-to-one correspondence. Each wiring layer 605 is used for the input of an address and a control signal and the input/output of data. These individual signal lines 605 are reduced in parasitic capacity and make use of rewiring layers each having a wiring width formed thin relatively in association with a plurality of pads provided in high density in order to transfer digital signals transmitted through the signal lines at high speed.

In the present embodiment, the rewiring layer 05 is used to allow the supply of power at low impedance. In the same drawing, a rewiring layer 105 having a thick wiring width, which is obtained by extending the left end of the semiconductor chip upwards and downwards and bending the same toward the center at upper and lower portions thereof, is provided to supply a source voltage VDD. The rewiring 105 is provided with three bump electrodes at its upper portion, one bump electrode in the center thereof, and three bump electrodes at its lower portion. The supply of the source voltage VDD is performed from seven places or points in total as viewed from the outside. The rewiring 105 comprises portions each having a thick wiring width, which is to serve as a main line, and portions which branch therefrom and are connected to a plurality of pads of the semiconductor chip at plurality of places or points through relatively thinner wirings. The supply of the source voltage VDD from these plural pads to circuit elements is carried out through such a top-layer wiring as described above.

A rewiring layer 205 having a thick wiring width, which is obtained by extending the right end of the semiconductor chip upwards and downwards and folding the same toward the center at upper and lower portions thereof, is provided to supply a ground potential VSS in a circuit. The rewiring layer 205 is provided with two bump electrodes at its upper portion, one bump electrode in the center thereof, and three bump electrodes at its lower portion. The supply of the ground potential VSS in the circuit is performed from six places or points in total as viewed from the outside. The rewiring 205 comprises portions each having a thick wiring width, which is to serve as a main line, and portions which branch therefrom and are connected to a plurality of pads of the semiconductor chip at plurality of places or points through relatively thinner wirings. The supply of the circuit ground potential VSS from these plural pads to circuit elements is carried out through such a top-layer wiring as described above. Using the rewiring layers each having the thick wiring width for the supply of the source voltages VDD, VSS, etc. yields the formation of a relatively large parasitic capacitance contrary to each signal line 605 referred to above. In the case of the source or power supply lines VDD and VSS, parasitic capacitances provided therefor will contribute to voltage stabilization.

In the present embodiment, power supply paths are provided independently for an output circuit to lessen the transfer of relatively large source noise produced in the output circuit to an input circuit and an internal circuit. Namely, each of rewiring layers 305 is used to supply a circuit ground potential VSSQ to the output circuit. The rewiring layers 305 are provided on the semiconductor chip with being divided into four and are provided with their corresponding bump electrodes for supplying the ground potential VSSQ thereto. These rewiring layers 305 are interconnected with one another by wirings placed on a printed circuit board or mounting board through the bump electrodes and supplied with the same ground potential VSSQ.

A rewiring layer 405 for supplying a source voltage VDDQ for the output circuit is disposed so that the central portion of the semiconductor chip is extended upwards and downwards. The rewiring layer 405 is provided with bump electrodes provided two by two at upper and lower ends and one bump electrode provided in its central portion and is supplied with the source voltage VDDQ from five points in total.

In the present embodiment, rewiring layers are used even for signal lines for transferring an AC signal in addition to the utilization of the rewiring layers for the purpose of the supply of the above-described DC voltage. A rewiring layer 505 is one for transmitting a clock CLK and is provided with the clock CLK from a bump electrode provided in the central portion of the semiconductor chip. The rewiring layer 505 serves so as to transfer the clock CLK to a pad provided in the central portion of the semiconductor chip and pads provided at upper and lower ends thereof. Thus, the clock CLK is distributed to the semiconductor chip formed in a relatively large size for the purpose of large storage capacity through the use of the rewiring layer 505 low in resistance value. Further, the skew of the clock CLK in the internal circuit is reduced and the speeding up of operation is enabled.

Although not restricted in particular, the DRAM chip according to the present embodiment has four memory banks and is a synchronous DRAM or a synchronous DRAM having a DDR configuration. Memory accesses are made from the four memory banks in 64-bit units. The input/output circuits are configured as sixty-four in number and placed side by side in upper and lower directions at the central portion of the semiconductor chip. Thus, the rewiring layers 305 and 405 used as the power lines for supplying the operating voltages VDDQ and VSSQ are provided as described above in association with the input/output circuits.

As described above, the sixty-four input/output circuits are dispersively disposed in the center of the semiconductor chip with a relatively long distance. Therefore, the distance between the adjacent input/output circuits placed at the upper and lower ends becomes long and hence the delay of propagation of the clock CLK appears as skew as it is, thereby interfering with the speeding up of the operation. Since the present embodiment is intended to provide the bump electrodes for supplying the clock CLK in the center and make branches upward and downward therefrom so as to distribute the clock CLK through the rewiring 505, a propagation delay in the supply path of the clock can be lessened by distributing the clock at a distance corresponding to one half the distance between the input/output circuits disposed at the upper and lower ends and making use of the rewiring 505 low in resistance. Namely, the clock skew takes the maximum between the circuit supplied with the clock from each of the pads provided adjacent to the bump electrodes and the circuit supplied with the clock from each of the pads provided at both ends. Thus, such a clock skew can greatly be reduced owing to the utilization of the rewiring 505 referred to above.

Figure 3:
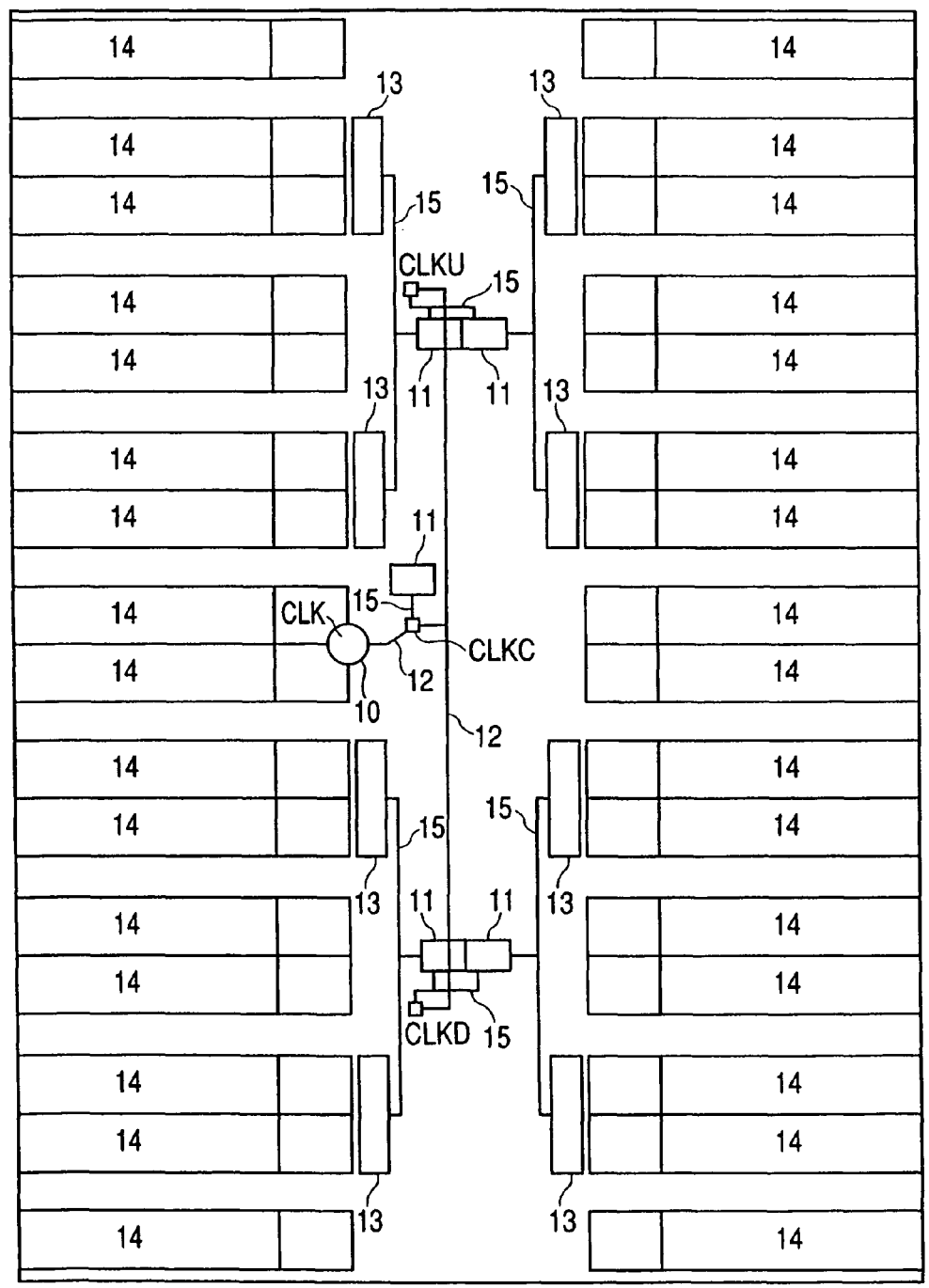
FIG. 3 is a schematic layout diagram illustrating one embodiment of a DRAM to which the present invention is applied.

A schematic layout diagram of one embodiment of a DRAM to which the present invention is applied, is shown in FIG. 3. The layout of the DRAM according to the present embodiment corresponds to the rewirings and pads of the DRAM shown in FIG. 2. In the same drawing, memory arrays or memory mats 14 are provided with being divided into plural parts. Input/output circuits are dispersively disposed in a vertical central portion of a semiconductor chip as described above, and input/output control circuits 13 are provided in association therewith. The input/output control circuits 13 are provided four by four with respect to the respective two separated memory arrays 14 so as to interpose the vertical central portion of the chip therebetween. Thus, one input/output control circuit 13 takes charge of the eight input/output circuits.

Of the input/output control circuits 13 provided four by four in association with the left and right memory arrays, ones divided two by two in the upper and lower directions are respectively set as pairs, and one clock input buffer 11 is assigned to each pair. Further, one clock input pads CLKU and CLKD are provided with respect to the two clock buffers 11 provided adjacent to each other from sided to side. A clock input pad CLKC is provided even in the center of the chip.

Theses clock input pads CLKU, CLKC and CLKD are interconnected with one another by means of a rewiring 12 for clock input. The rewiring 12 is connected even to a solder bump electrode 10 for clock input. Owing to such a configuration, a clock CLK inputted from the solder bump electrode 10 for clock input is transmitted to the clock input pads CLKC, CLKU and CLKD through the rewiring 12.

The clock CLK is transferred from the clock input pads CLKU, CLKC and CLKD to the corresponding clock input buffer 11 through top metal wiring layers 15 of the DRAM chip, which comprise aluminum or the like. Although not restricted in particular, internal clock signals formed or produced from the respective clock input buffers 11 are similarly transmitted to their corresponding input/output control circuits 13 through the top metal wiring layers 15 of the DRAM chip, which comprise aluminum or the like. Although not restricted in particular, the clock input buffer 11 provided in association with the clock input pad CLKC forms internal clock signals supplied to an unillustrated address input circuit, a data input circuit or input circuits or the like such as control signal input circuits or the like for RAS, CAS, WE, etc.

Figure 4:
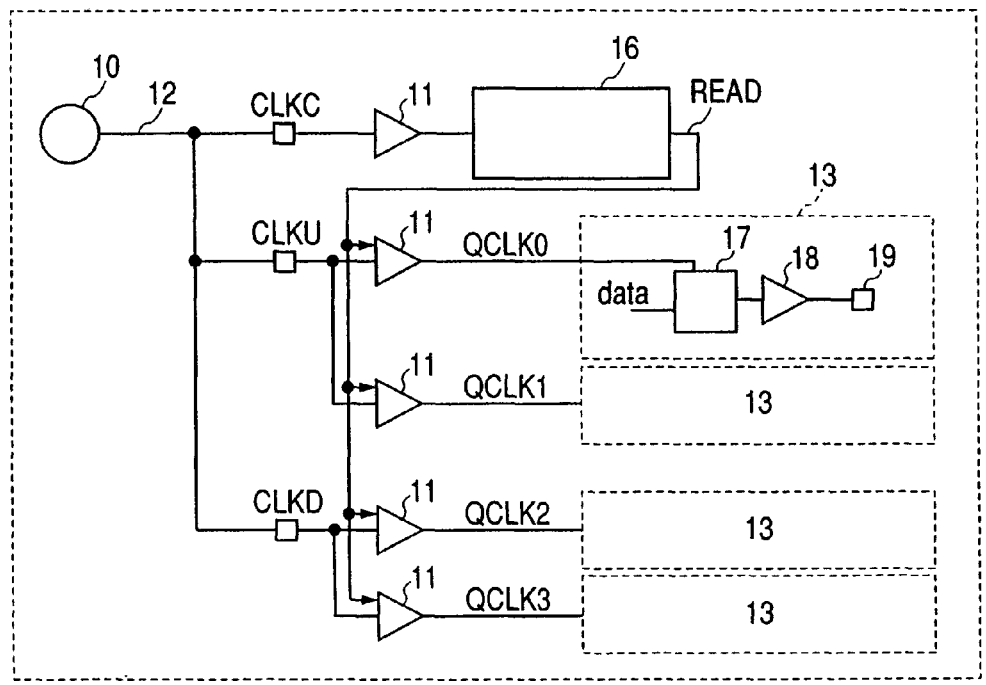
FIG. 4 is a block diagram showing one embodiment of a clock input unit of the semiconductor integrated circuit device according to the present invention.

A block diagram of one embodiment of a clock input unit of a semiconductor integrated circuit device according to the present invention is shown in FIG. 4. The present embodiment corresponds to the clock input circuit of the DRAM shown in FIG. 3.

A clock input bump electrode 10 is connected to clock input pads CLKU, CLKC and CLKD by means of a rewiring 12. A clock supplied from the clock input pad CLKC is transmitted to the input of a clock input buffer 11. An internal clock outputted from the clock input buffer 11 is transferred to a read/write control circuit 16. If the read/write control circuit 16 receives instructions for a read operation according to an unillustrated command, it forms a read control signal READ.

The read control signal READ is set as a control signal used for each of the clock input buffers 11 provided in association with the clock input pads CLKU and CLKD. If the read control signal READ is regarded as an effective level, then the clock input buffers 11 form or produce output register clocks QCLK0 through QCLK3 from the clock signals inputted via the clock input pads CLKU and CLKD and transfer them to output register circuits 17 included in input/output control circuits 13, respectively. The output register circuits 17 take in or capture read data data according to the output register clocks QCLK0 through QCLK3 and transfer output signals to input/output pads 19 through output buffer circuits 18, respectively. These input/output pads 19 are connected to input/output bump electrodes through unillustrated rewirings respectively.

Figure 5:
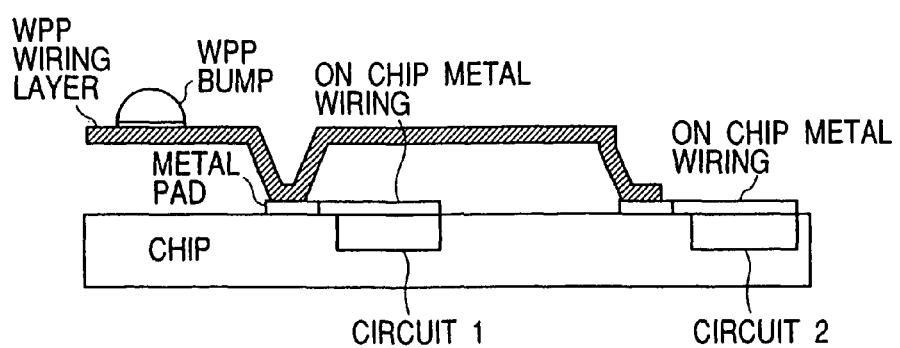
FIG. 5 is a schematic cross-sectional view illustrating one embodiment of the semiconductor integrated circuit device according to the present invention.

A schematic cross-sectional view of one embodiment of the semiconductor integrated circuit device according to the present invention is shown in FIG. 5. Although not restricted in particular, the present embodiment corresponds to the clock input unit shown in FIG. 3 or FIG. 4.

Since the semiconductor integrated circuit device showing the present embodiment is formed up to a package according to a wafer process as shown in FIGS. 20 through 24 to be described later, the rewirings and bump electrodes might be called "WPP (an abbreviation of Wafer Process Package) wirings (layer) or WPP bumps". The following description will be made using the WPP wiring layers or WPP bumps. The WPP bumps are formed on the WPP wiring layer and electrically connected to one another. The WPP wiring layer adheres onto the organic insulating film not shown and is connected to a metal pad PAD on a chip at its opening. The metal PAD is electrically connected to a circuit 1 through a metal wiring corresponding to a top layer on the chip. Although not restricted in particular, the metal PAD corresponds to the clock input pad CLKC, and the circuit 1 corresponds to each of the clock input buffers 11.

The WPP wiring layer further extends from a metal PAD portion corresponding to the circuit 1 so as to connect to a metal PAD corresponding to a circuit 2 at its opening. The metal PAD and the circuit 2 are connected to each other by means of a metal wiring on the chip in the same manner as described above. The circuit 2 is controlled in operation according to the read control signal READ and constitutes one input buffer 11 which receives therein a clock signal inputted via an unillustrated clock input pad CLKU or CLKD.

Figure 6:
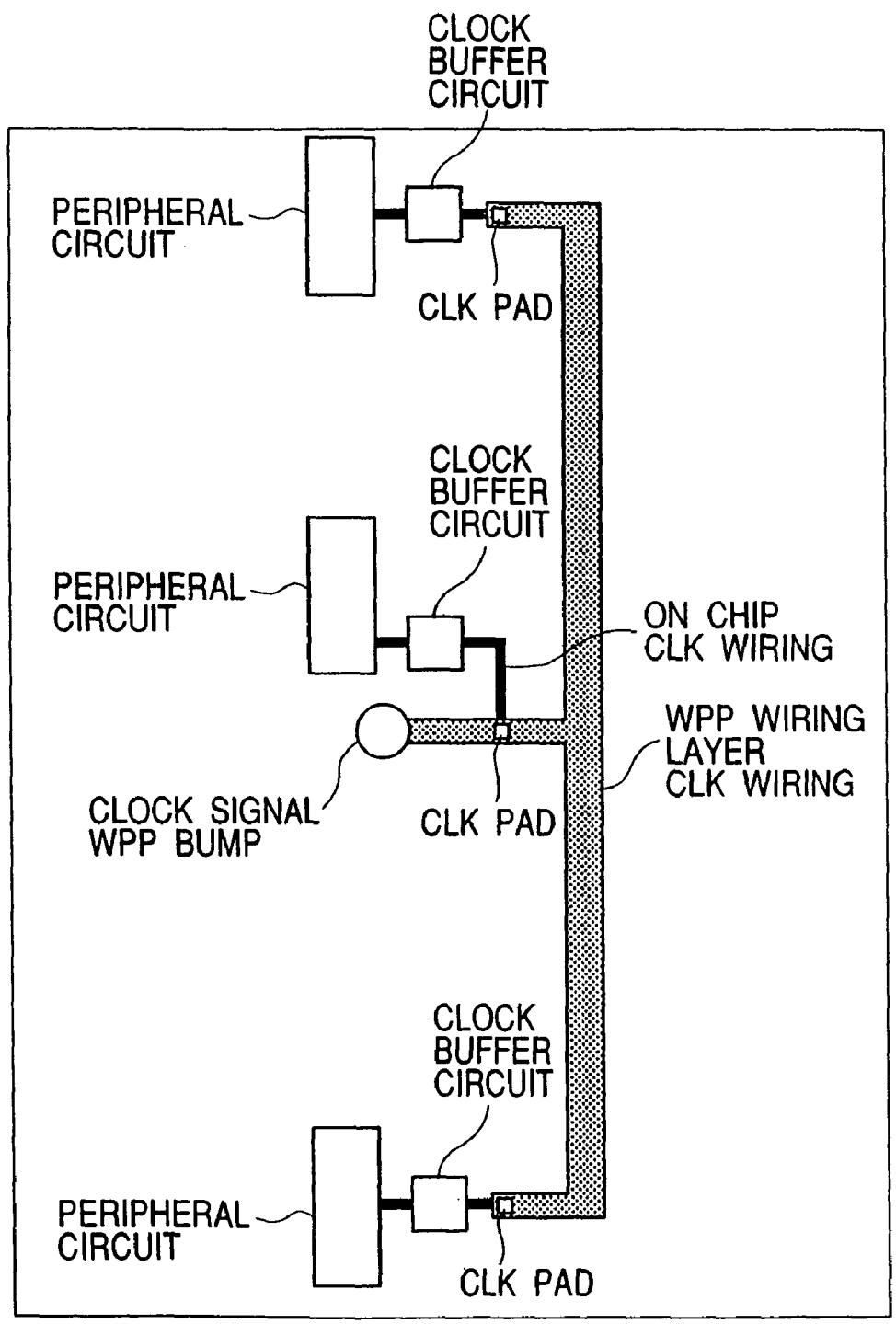
FIG. 6 is a schematic plan view depicting one embodiment of the semiconductor integrated circuit device according to the present invention.

A schematic plan view of one embodiment of the semiconductor integrated circuit device according to the present invention is shown in FIG. 6. Although not restricted in particular, the present embodiment corresponds to the clock input unit shown in FIG. 3 or FIG. 4.

A clock signal WPP bump similar to the above is formed on a WPP wiring layer to provide electrical connections. The WPP wiring layer is mounted onto the organic insulating film not shown and is connected to a CLK PAD (clock pad) on a chip at its opening. The CLK PAD is connected to a clock buffer circuit by a CLK wiring that comprises a metal wiring of a top layer on the chip, and is connected to a peripheral circuit by a similar wiring. The peripheral circuit constitutes the read/write control circuit 16, for example.

The WPP wiring layer is extended so as to further branch up and down from the CLK PAD unit corresponding to the clock buffer circuit and is connected to two CLK PADs corresponding to the CLKU and CLKD at their openings. These CLK PADs are connected to their corresponding peripheral circuits by metal wirings on the chip in a manner similar to the above. The peripheral circuits are controlled in operation according to the read control signal READ and respectively constitute output control circuits 13 each including an input buffer 11 receiving a clock signal inputted via an unillustrated clock input pad CLKU or CLKD.

Figure 7:
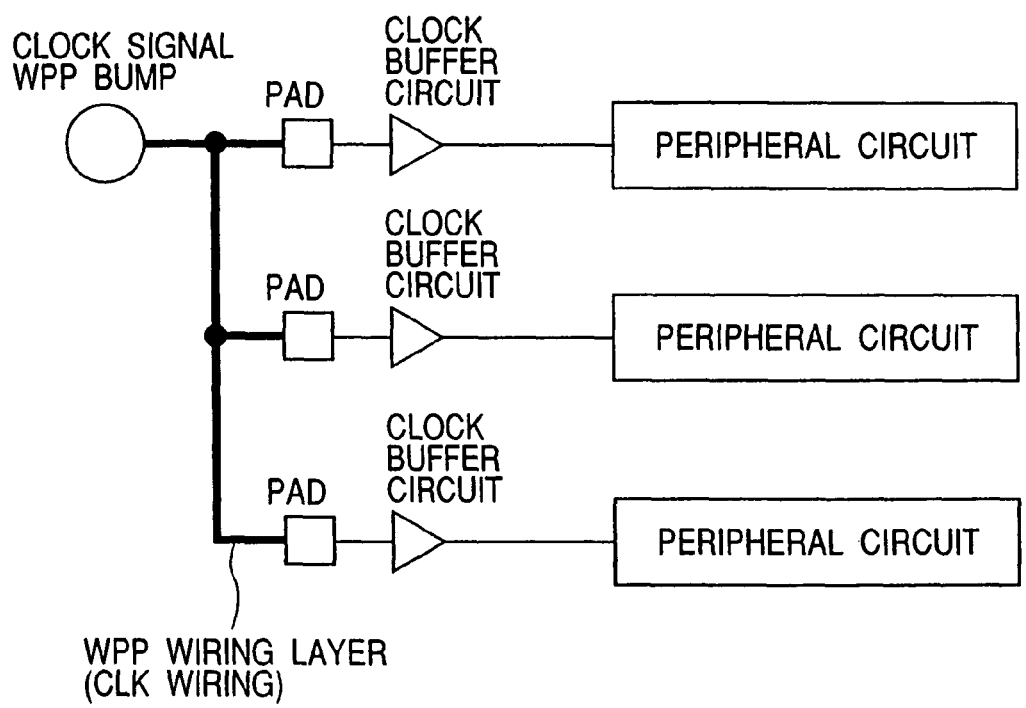
FIG. 7 is a block diagram showing one embodiment of the semiconductor integrated circuit device according to the present invention.

A block diagram of one embodiment of the semiconductor integrated circuit device according to the present invention is shown in FIG. 7. Although not restricted in particular, the present embodiment corresponds to the clock input unit shown in FIG. 3 or FIG. 4.

A clock signal WPP bump similar to the above is formed on a WPP wiring layer to provide electrical connections. The WPP wiring layer is mounted onto the organic insulating film not shown and is connected to clock signal WPP bumps at their openings. The WPP wiring layer (CLK wiring) is connected to pads PADs associated with clock buffer circuits for peripheral circuits to which the WPP wiring layer is distributed.

In present embodiment, even up to pads PADs corresponding to input portions of clock buffers in the peripheral circuits to which the WPP wiring layer is distributed, are introduced from the clock signal WPP bump by means of clock wirings low in resistance, which comprise the above-described WPP wirings (rewirings). Therefore, signal delays thereat become small and mutual clock skews are also reduced. The respective pads PADs correspond to the respective pads illustrated in the embodiments shown in FIGS. 3 through 6. Thus, the respective peripheral circuits are associated with the read/write control circuit 16 and each of the output circuits 13.

Figure 8:
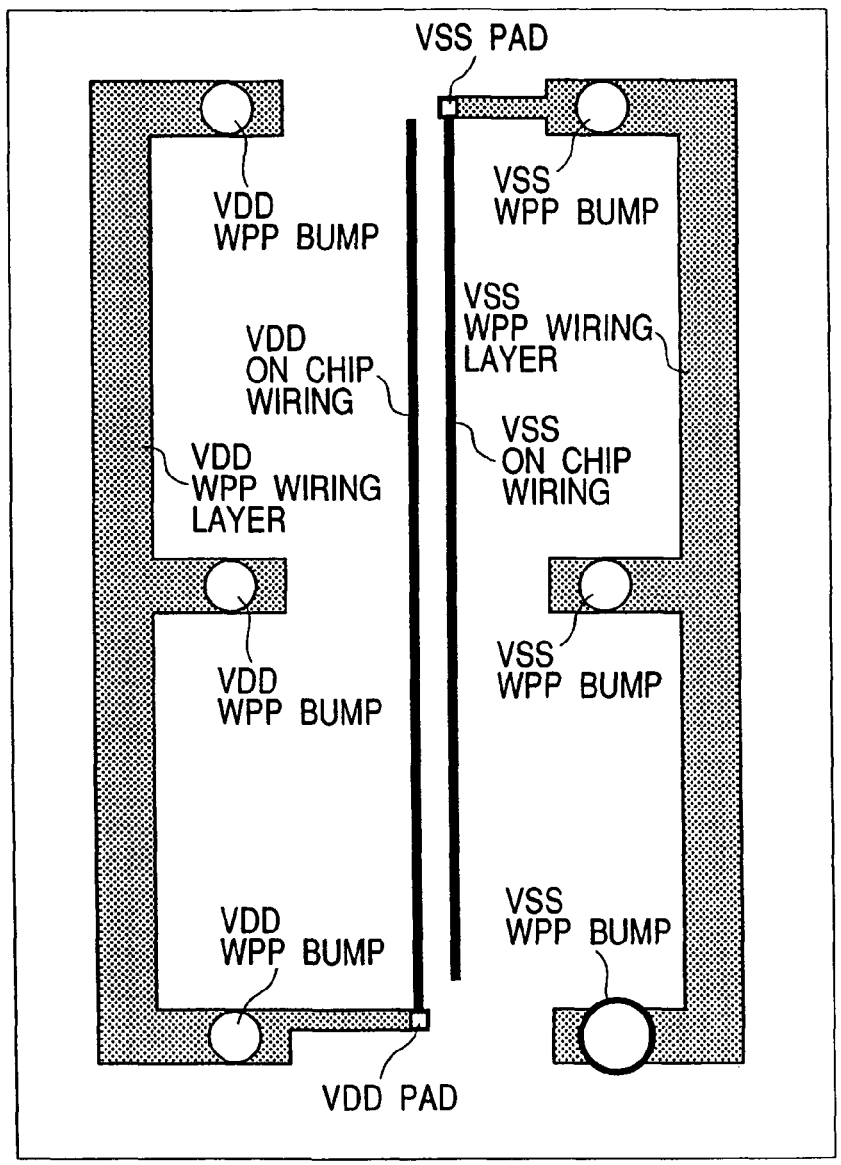
FIG. 8 is a schematic plan view illustrating one embodiment of the semiconductor integrated circuit device according to the present invention.

A schematic plan view of one embodiment of the semiconductor integrated circuit device according to the present invention is shown in FIG. 8. The present invention is intended for a distributed example of external sources or power supplies. Power supply paths for a source voltage VDD and a circuit ground potential VSS are shown for respective circuits formed on a semiconductor chip.

A pair of WPP wirings is provided so that the left and right ends of the semiconductor chip extend upward and downward. Of the pair of WPP wirings, the WP wiring placed on the left side serves so as to supply the source voltage VDD although not restricted in particular. At the upper and lower ends and the central portion of the WPP wiring, WPP bumps are respectively provided at protrusions respectively provided so as to branch to the middle side of the chip. The source voltage VDD is supplied from the three points of the upper and lower ends and the central portion referred to above. Further, the WPP wiring placed on the right side serves so as to supply the circuit ground potential VSS. At the upper and lower ends and the central portion of the WPP wiring, WPP bumps are respectively provided at protrusions respectively provided so as to branch to the middle side of the chip. The circuit ground potential VSS is supplied from three points of the upper and lower ends and the central portion thereof.

Of the WPP wiring layer for the source voltage VDD, although not restricted in particular, a WPP wiring, which has further extended from the WPP bump to the central portion of the chip on the lower end side, is formed and connected to its corresponding pad VDD PAD. The pad VDD PAD is connected to a wiring on the chip and serves so as to supply the source voltage VDD to each circuit element formed on the semiconductor chip through such an on chip wiring. Incidentally, in order to reduce source impedance, thin WPP wirings are caused to suitably branch off from the thick WPP wiring constituting the main line and are connected to their corresponding pads. VDD PADs similar to the above. Such VDD PADs may be interconnected with one another by means of the on chip wiring.

Of the WPP wiring layer for the circuit ground potential VSS, a WPP wiring, which has further extended from the WPP bump to the central portion of the chip on the upper end side, is formed and connected to its corresponding pad VSS PAD. The pad VSS PAD is connected to a wiring on the chip and serves so as to supply the circuit ground potential VSS to each circuit element formed on the semiconductor chip through such an on chip wiring. Incidentally, in order to reduce source impedance, thin WPP wirings are caused to suitably branch off from the thick WPP wiring constituting the main line and are connected to their corresponding pads VSS PADs similar to the above. Such VSS PADs may be interconnected with one another by means of the on chip wiring.

Figure 9:
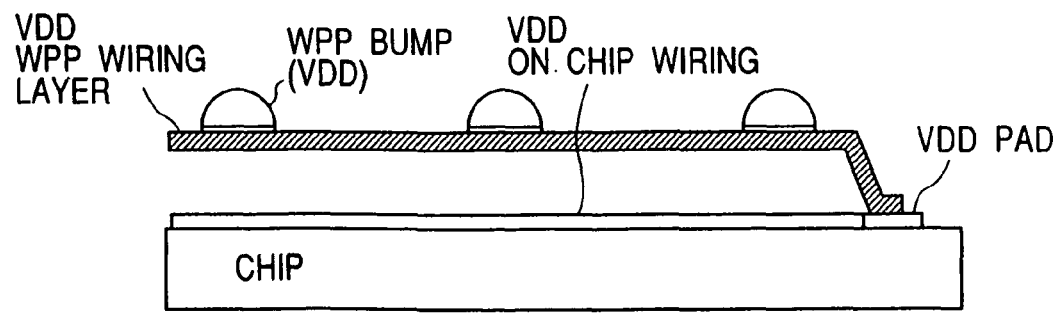
FIG. 9 is a schematic cross-sectional view showing one embodiment of the semiconductor integrated circuit device according to the present invention.

A schematic cross-sectional view of one embodiment of the semiconductor integrated circuit device according to the present invention is shown in FIG. 9. Although not restricted in particular, the present embodiment is intended for the power supply path used for the source voltage VDD (or circuit ground potential VSS) employed in the embodiment of FIG. 7.

WPP bumps are formed on a WPP wiring layer (VDD) to provide electrical connections. The WPP wiring layer is mounted onto the organic insulating film not shown, and the WPP bumps equal to the three in total are provided thereover. The WPP wiring layer is connected to its corresponding pad VDD PAD at an opening defined in the organic insulating film. The pad VDD PAD is connected to an on chip wiring, i.e., a metal wiring corresponding to a top layer and serves so as to supply the source voltage VDD to each of unillustrated circuit elements through such an on chip wiring.

Figure 10:
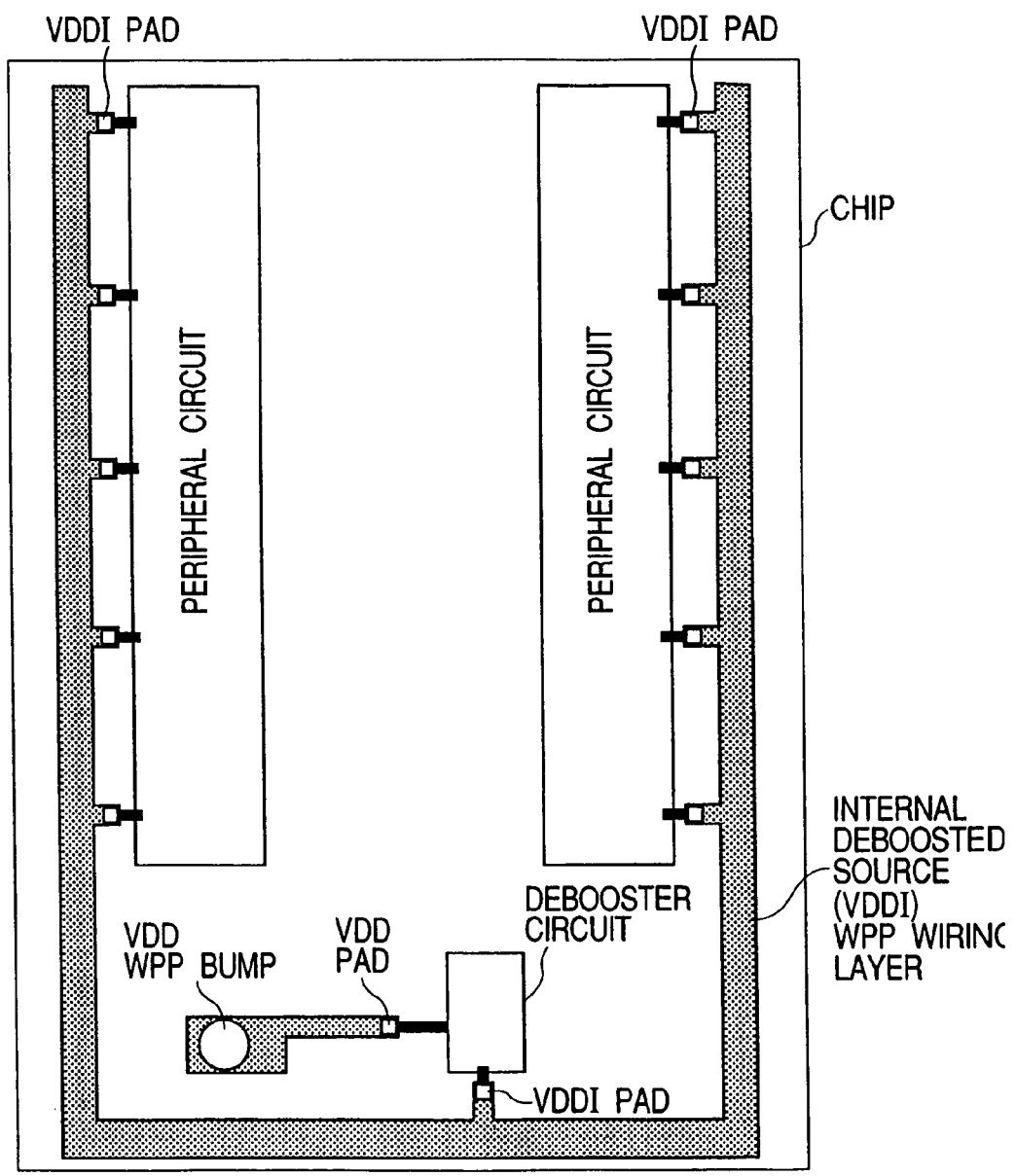
FIG. 10 is a schematic plan view illustrating another embodiment of a semiconductor integrated circuit device according to the present invention.

A schematic plan view of another embodiment of a semiconductor integrated circuit device according to the present invention is shown in FIG. 10. The present invention is intended for a distributed example of internal sources. A power supply path for an internal voltage VDDI obtained by deboosting or decreasing a source voltage VDD supplied from outside is shown for respective circuits formed on a semiconductor chip.

A WPP wiring is provided so that the right and left ends and the lower end of the semiconductor chip are extended. The WPP wiring serves as a source or power wiring used for supplying the internal voltage VDDI. Of the WPP wiring, the WPP wiring extended in the horizontal direction at the lower end is provided with a branch and connected to a pad VDDI PAD therethrough. The pad VDDI PAD serves so as to transfer a stepped-down voltage VDDI formed by a step down circuit through an on chip wiring. Thus, such a WPP wiring layer that the right and left ends and the lower end are extended, surrounds the semiconductor chip to transfer the stepped-down voltage VDDI. Further, the stepped-down voltage VDDI is supplied to peripheral circuits with such a voltage VDDI as an operating voltage, through pads VDDI PADs provided in plural places.

A WPP bump for VDD is provided for the supply of the source voltage VDD to the step-down circuit and connected to its corresponding pad VDD PAD by the WPP wiring layer. The pad VDD PAD is connected to an on chip wiring, and hence the source voltage VDD is supplied to the step-down circuit through such an on chip wiring. When a circuit with the source voltage VDD as an operating voltage is placed on the semiconductor chip although it is not shown in the drawing, it is connected via the WPP wiring layer connected to the WPP bump for VDD to the pad VDD PAD provided in association with the circuit having need of it. Thus, the supply of the source voltage VDD is performed in a manner similar to the step-down circuit.

A schematic configurational view of a further embodiment of a semiconductor integrated circuit device according to the present invention is shown in FIGS. 11(A) and 11(B). In addition to the provision of a WPP wiring layer in a one-to-one correspondence between a WPP bump and a pad PAD, the WPP wiring layer is used as parts of a signal line and a power supply line. In this case, it is necessary to electrically isolate wirings different from one another and place the wirings in crossed form. Multilayering the WPP wiring makes it easy to cross the wirings while they are being electrically isolated in this way. However, a process for manufacturing the WPP wiring becomes complex, thus increasing its manufacturing cost.

The present embodiment is intended to, when a WPP wiring extended in a horizontal direction as shown in FIG. 11(A) and a wiring extended in a vertical direction orthogonally to it are electrically isolated from each other and placed so as to intersect each other, place the wiring extended in the vertical direction on an on chip wiring at its intersection and separate it therefrom as shown in FIG. 11(B). Namely, in FIG. 11(A), a WPP bump used for an external input signal, which is provided on the upper side of the WPP wiring layer extended in the horizontal direction, is connected to the on chip wiring formed on the lower side with an organic insulating film of the WPP wiring layer extended in the horizontal direction being interposed therebetween, via the pad PAD through the use of the WPP wiring. Such an on chip wiring is introduced into the corresponding pad PAD through the lower side of the WPP wiring layer extended in the horizontal direction. The on chip wiring is connected to its corresponding WPP wiring again therefrom and intersects another on chip wiring, followed by connection to the pad PAD for the external input signal.

Even if the WPP wiring layer extended in the horizontal direction in FIG. 11(A) constitutes a source or power line for transferring the internal stepped-down voltage and external source voltage, the input signal line can be provided so that such a power line intersects it as in the present embodiment. Further, the degree of freedom of the layout of circuits formed on a semiconductor chip can be increased. Namely, signal lines used for the input of address signals and data and the output of data, which are in need of a high-speed operation, are placed with WPP bumps and pads being respectively provided with relatively short distances therebetween. A WPP bump used for signal input, which corresponds to a signal line being in no need of high-speed signal transfer as in the case of a signal line for performing switching between operation modes, is formed in a space area so as to avoid the portions where the WPP bumps corresponding to the input of the address signals and data and the output of data are formed. Such WPP bumps may be formed of the WPP wiring including the on chip wiring at the above-described intersection.

Figure 12:
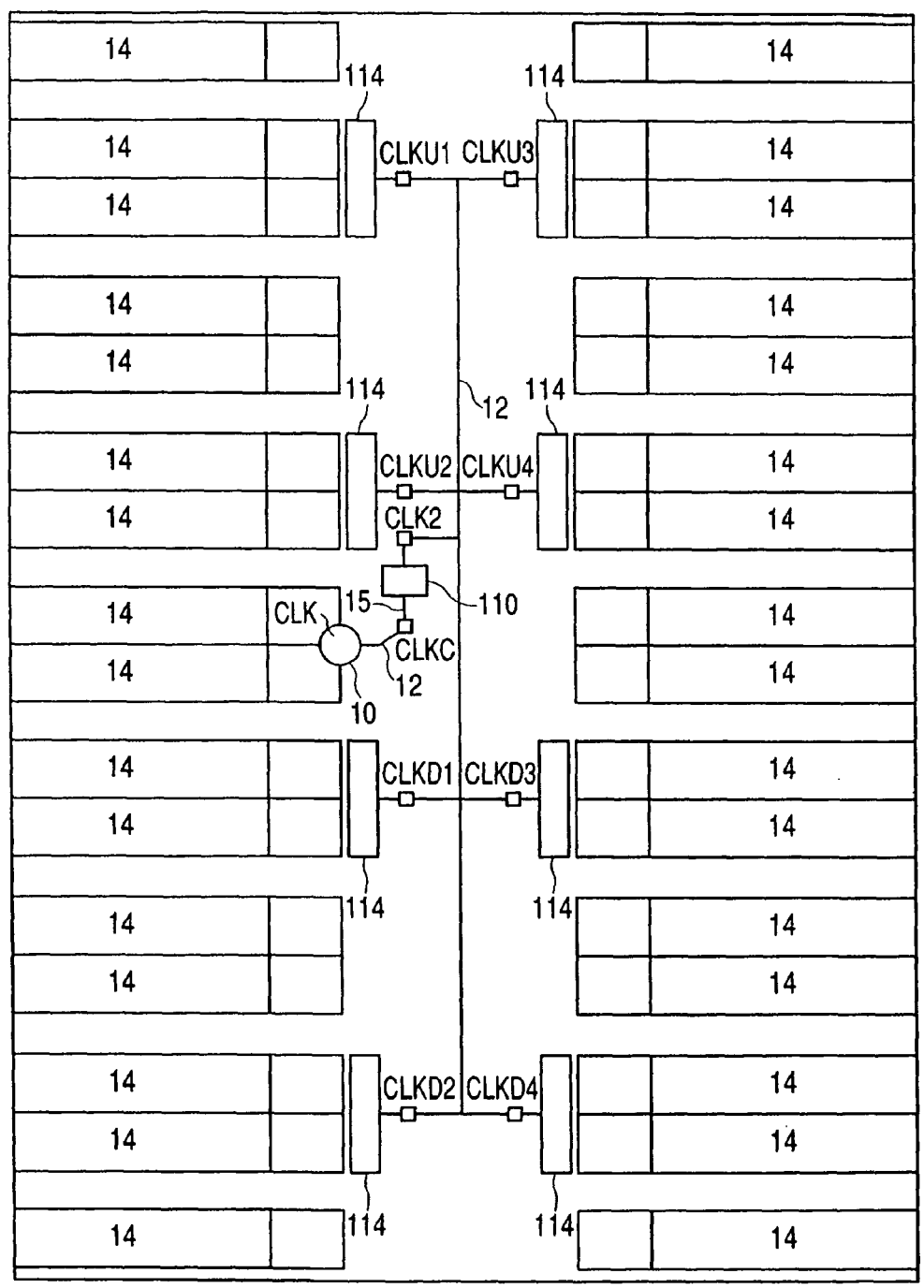
FIG. 12 is a schematic layout diagram illustrating another embodiment of a DRAM to which the present invention is applied.

A schematic layout diagram of another embodiment of a DRAM to which the present invention is applied, is shown in FIG. 12. The layout of the DRAM according to the present embodiment corresponds to the rewirings and pads of the DRAM shown in FIG. 2 except for a clock input system. Namely, memory arrays or memory mats 14 are provided so as to be divided into plural form in the same manner as described above. Sixty-four input/output circuits are dispersively disposed in a vertical central portion of a semiconductor chip in a manner similar to the above. Input/output control circuits 114 are provided in association with the input/output control circuits. The input/output control circuits 114 are provided four by four with respect to the respective two separated memory arrays 14 so as to interpose the vertical central portion of the chip therebetween. Thus, one input/output control circuit 114 takes charge of the eight input/output circuits.

The four-by-four provided output control circuits 114 provided in association with the right and left memory arrays are respectively provided with pads CLKU1 through CLKU4 and CLKD1 through CLKD4 for the input of a clock supplied thereto. An internal clock formed by a clock reproducing circuit 110 is transferred to each of the pads through the use of a rewiring 12. A clock CLK inputted from a solder bump electrode 10 for clock input is sent via the rewiring 12 to a pad CLKC, from which the clock is transmitted to the clock reproducing circuit 110 through an on chip wiring 15. The clock reproducing circuit 110 comprises a PLL circuit or a DLL or SMD circuit and forms or produces an internal clock signal corresponding to the clock CLK supplied from outside. The thus-formed internal clock signal is sent via the on chip wiring to a pad CLK2 from which the clock is distributed to the respective clock input pads CLKU1 through CLKU4 and CLKD1 through CLKD4 by means of the rewiring 12.

Figure 13:
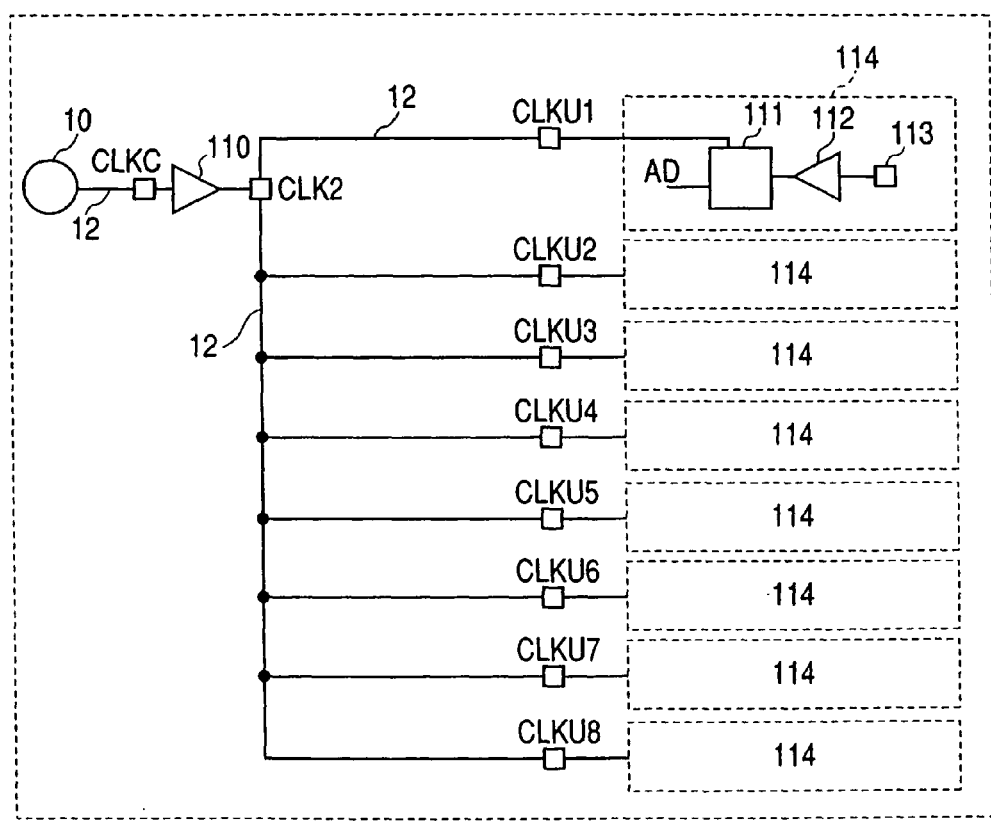
FIG. 13 is a block diagram showing one embodiment of a clock input unit of the DRAM shown in FIG. 12.

A block diagram of one embodiment of a clock input unit of the DRAM shown in FIG. 12 is shown in FIG. 13. A bump electrode 10 for clock input is connected to a clock input pad CLKC by means of a rewiring 12. A clock supplied from a clock input pad CLKC is transferred to a clock reproducing circuit 110 by an on chip wiring. The clock reproducing circuit 110 comprises a clock synchronous circuit like the PLL circuit, DLL circuit or SMD circuit and forms an internal clock signal synchronized with the clock supplied from the clock input bump electrode 10 so as to have a predetermined phase difference.

If, for example, the clock supplied from outside is sent to each internal circuit as it is, then an internal clock will lag by a signal delay developed in an input buffer circuit having received the clock supplied from outside. The PLL circuit, DLL circuit or SMD circuit is used to compensate for such a phase delay.

The PLL (Phase-Locked Loop) circuit causes a phase comparator to detect a phase difference (frequency difference) between a clock supplied from outside and a clock formed or produced by a voltage-controlled oscillator circuit such as a VCO or the like by comparison, and produces such a control signal as to allow the two to coincide with each other, thereby controlling the VCO. In other words, the PLL circuit is capable of inserting a delay circuit formed of a replica circuit corresponding to the input buffer within the PLL loop for the clocks compared by the phase comparator, thereby canceling the phase difference between the external clock and the internal clock or greatly forming the delay time larger than a delay time in the input buffer to thereby cause the phase of the internal clock to lead that of the external clock.

When, for example, an internal clock advanced in phase is generated, the PLL circuit can compensate for a signal delay of an output circuit upon the output of data according to such an internal clock and output data in synchronism with the clock supplied from the outside. If an N dividing circuit is inserted within the PLL loop, then the PLL circuit can form or produce an internal clock whose frequency is obtained by multiplying that of the external clock by N.

The DLL (Delay Locked Loop) circuit compares a clock delayed by a variable delay circuit and a clock inputted with a delay of one period or cycle through the use of a phase comparator and controls a delay time of the variable delay time so that the two coincide with each other. Inserting a delay circuit formed of a replica circuit corresponding to each input buffer for clock input for the clocks compared by the phase comparator in a manner similar to the PLL circuit makes it possible to cancel or eliminate the phase difference between the external clock and the internal clock. Alternatively, the delay time is formed larger than a delay time of the input buffer to allow the phase of the internal clock to lead that of the external clock.

The SMD (Synchronous Mirror Delay) circuit is of a clock synchronous circuit which does not include a feedback loop, like the PLL circuit and the DLL circuit. The time (lock time) necessary for synchronization is short like 2 to 3 cycles. The lock time can be shortened by measuring the cycle of an input clock as the number of stages of delay circuits. This measuring circuit is one for measuring a delay time per stage corresponding to a constituent element or component of each delay circuit as time resolution. In general, this time becomes equivalent to about a delay time corresponding to two stages of CMOS inverter circuits. As an example of the clock synchronous circuit using such an SMD, there is known one disclosed in Unexamined Patent Publication No. Hei 8 (1996)-237091.

The internal clock generated by the clock reproducing circuit 110 is introduced via the on chip wiring into the pad CLK2 from which the internal clock is distributed to clock input pads CLKU1 through CLKU8 of input/output control circuits 114 by rewirings 12. The input/output control circuit 114 includes, for example, an address input pad 113, an address input buffer 112 which receives an address signal inputted from the address input pad 113, and an address input register 111 for taking in or capturing the address signal. The internal clock is supplied to the address input register 111. In this case, the external clock and the internal clock transferred to the address register are synchronized with each other to thereby allow compensation for a signal delay in a clock input path.

Figure 14:
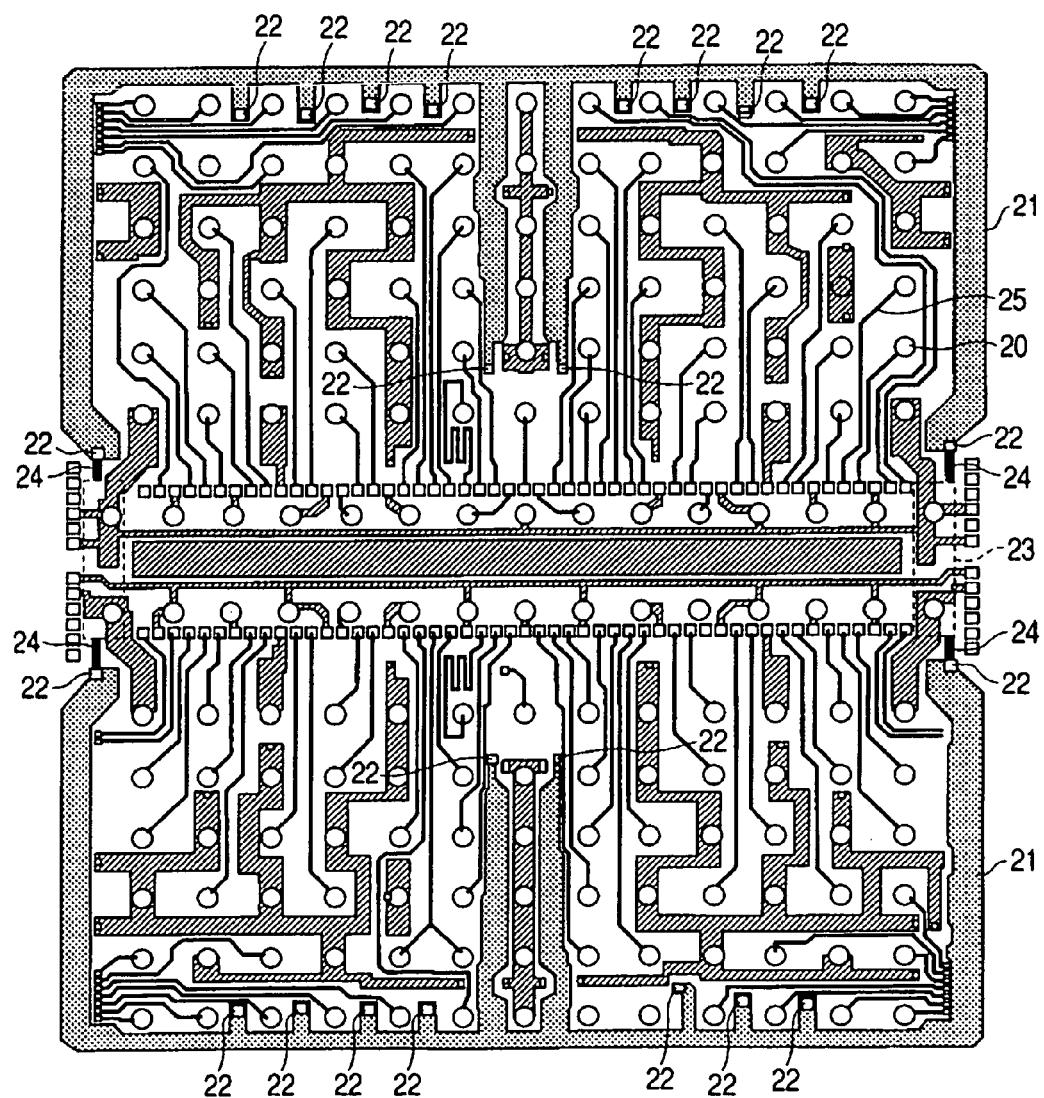
FIG. 14 is a plan view illustrating a still further embodiment of a semiconductor integrated circuit device according to the present invention.

A plan view of a still further embodiment of a semiconductor integrated circuit device according to the present invention is shown in FIG. 14. Although not restricted in particular, the semiconductor integrated circuit device showing the present embodiment is intended for a static RAM (Random Access Memory). A layout of rewirings, and bump electrodes and pads connected thereto is shown therein.

In a manner similar to the above even in the same drawing, bump electrodes 20, etc. are respectively indicated by ○ and pads 22, etc. are respectively indicated by small □. These bump electrodes and pads are interconnected with each other by their corresponding rewirings 21 and the like. Even in the present embodiment, the rewirings are divided into two types for a DC voltage and an AC signal according to the functions thereof. One rewiring layer 25 illustratively shown is identical to the rewiring employed in the conventional wafer/level CSP (chip size package) and connects one bump electrode and one pad to each other in a one-to-one correspondence. Each rewiring layer 25 is used for the input of an address and a control signal and the input/output of data. These individual signal lines 25 are reduced in parasitic capacity and make use of rewiring layers each having a wiring width relatively formed thin in association with a plurality of pads provided in high density in order to transfer digital signals transmitted through the signal lines at high speed.

In the present embodiment, the rewiring layer is used to allow the supply of power under low impedance. In the same drawing, rewiring layers 21 each having a thick wiring width, which extend along chip peripheral portions at an upper half portion and a lower half portion of a semiconductor chip, are provided to supply an internal stepped-down voltage VDDI. Stepped-down voltages VDDI formed by debooster or step-down circuits 23 indicated by dotted lines on both sides as viewed from side to side, of the central portion of the chip, are transmitted to their corresponding rewiring layers 21 through on chip wirings 24 such as aluminum wiring. When a source voltage VDD is given as 3.3V, for example, the stepped-down voltage VDDI is set to a low voltage like 1.5V.

Of the rewirings other than the rewirings 21, rewirings each formed with a relatively thick wiring width except for the thin rewirings for the signal input includes ones for supplying a circuit ground potential VSS, for example, or ones for supplying a source voltage VDD, and are set to a source voltage VDDQ for an output circuit and a circuit ground potential VSSQ or the like in order to lessen the influence of power noise in a manner similar to the above. A plurality of bump electrodes are provided for these, and the same voltage like the VSS or VDD is supplied from the bump electrodes. In the SRAM according to the present embodiment, peripheral circuits are disposed in vertical and horizontal central portions of the chip, and a memory array is provided so as to be dispersed as four areas by such peripheral circuits.

Figure 15:
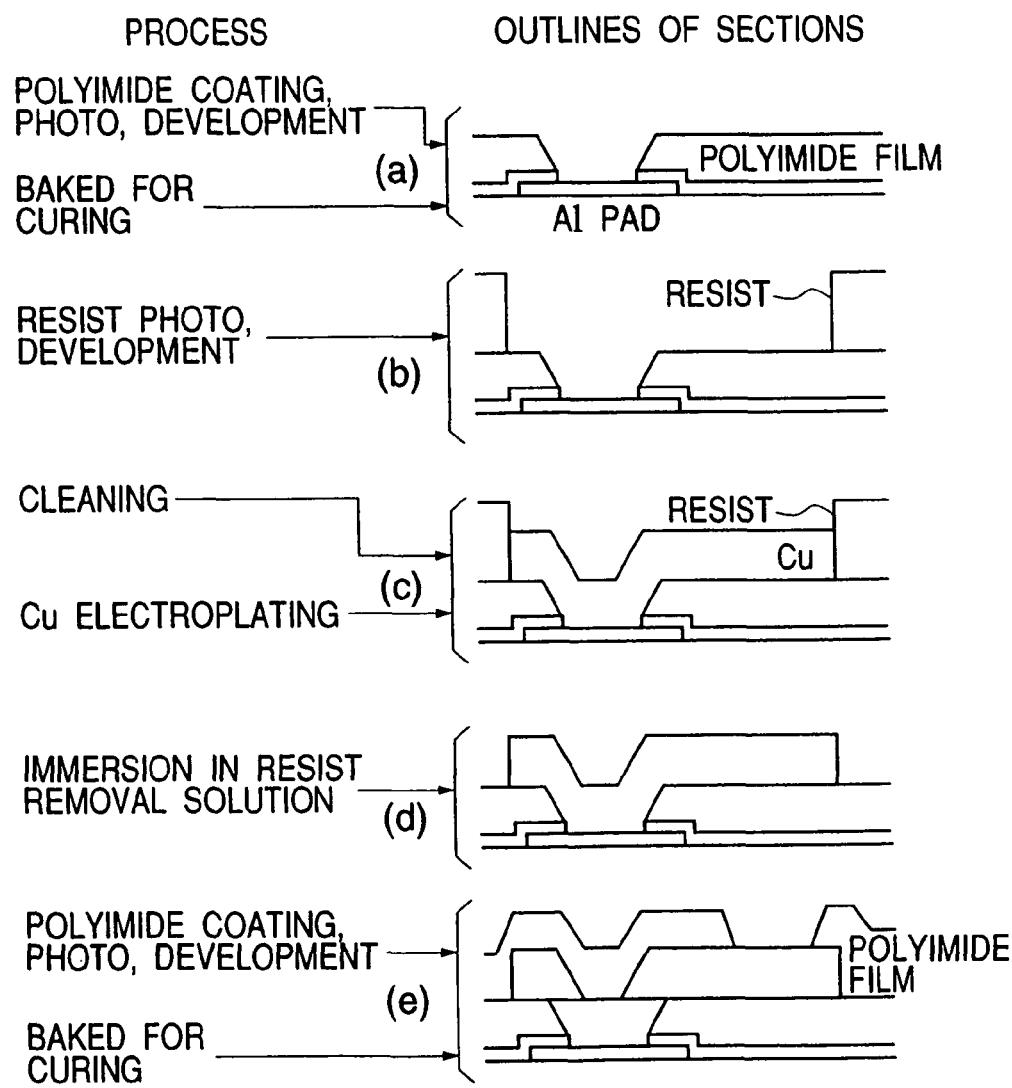
FIG. 15 is a schematic cross-sectional view for describing one embodiment of a method for manufacturing rewiring, according to the present invention.

A schematic cross-sectional view for describing a method of manufacturing the rewirings is shown in FIG. 15. In FIG. 15(a), polyimide corresponding to an organic insulating film is applied after the completion of a circuit on a semiconductor substrate (wafer). An organic insulating film having an opening is formed on an aluminum (Al) pad by a photolithography technology (photo and development) and baked for curing. In FIG. 15(b), a resist film is formed and processed by the photolithography technology (photo and development) to form wiring patterns for rewirings. In FIG. 15(c), Cu (Copper) is electroplated after cleaning. In FIG. 15(d), the resultant product is immersed in a resist film removing solution. In FIG. 15(e), an upper organic insulating film is formed. Namely, polyimide is applied in the same manner as described above and an upper organic insulating film having an opening at each bump electrode is formed by the photolithography technology (photo and development) and baked for curing.

Figure 16:
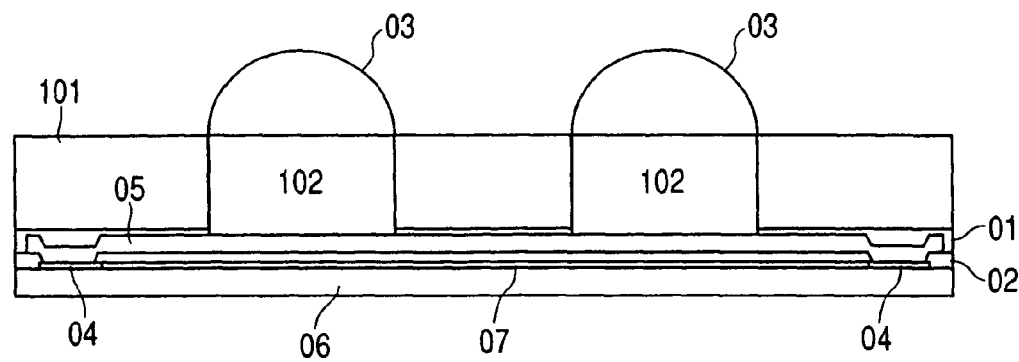
FIG. 16 is a cross-sectional view of another embodiment illustrative of rewirings provided in a semiconductor integrated circuit device according to the present invention.

A cross-sectional view showing another embodiment illustrative of rewirings provided in a semiconductor integrated circuit device according to the present invention is shown in FIG. 16. Unillustrated circuit elements and wirings are formed on one main surface side of a semiconductor chip. Of the wirings, pads 04 are formed of the wiring lying in the top layer. An organic insulating film 02 corresponding to a first layer is formed except for openings for the pads 04. Although not restricted in particular, the organic insulating film 02 is formed of polyimide.

A rewiring layer 05 used as a conductive layer for electrically connecting between at least two pads 04 formed on the main surface side of the semiconductor chip 06 is formed on the organic insulating film corresponding to the first layer formed of such polyimide. Cu (Copper) posts are provided at portions where bump electrodes 03 are formed, of the surface of such a rewiring layer 05. An encapsulating resin 101 is formed on a portion other than the portions. Further, the bump electrodes 03 are provided on the surfaces of the Cu posts. As the bump electrodes 03, at least two are provided for one rewiring 05.

Figure 17:
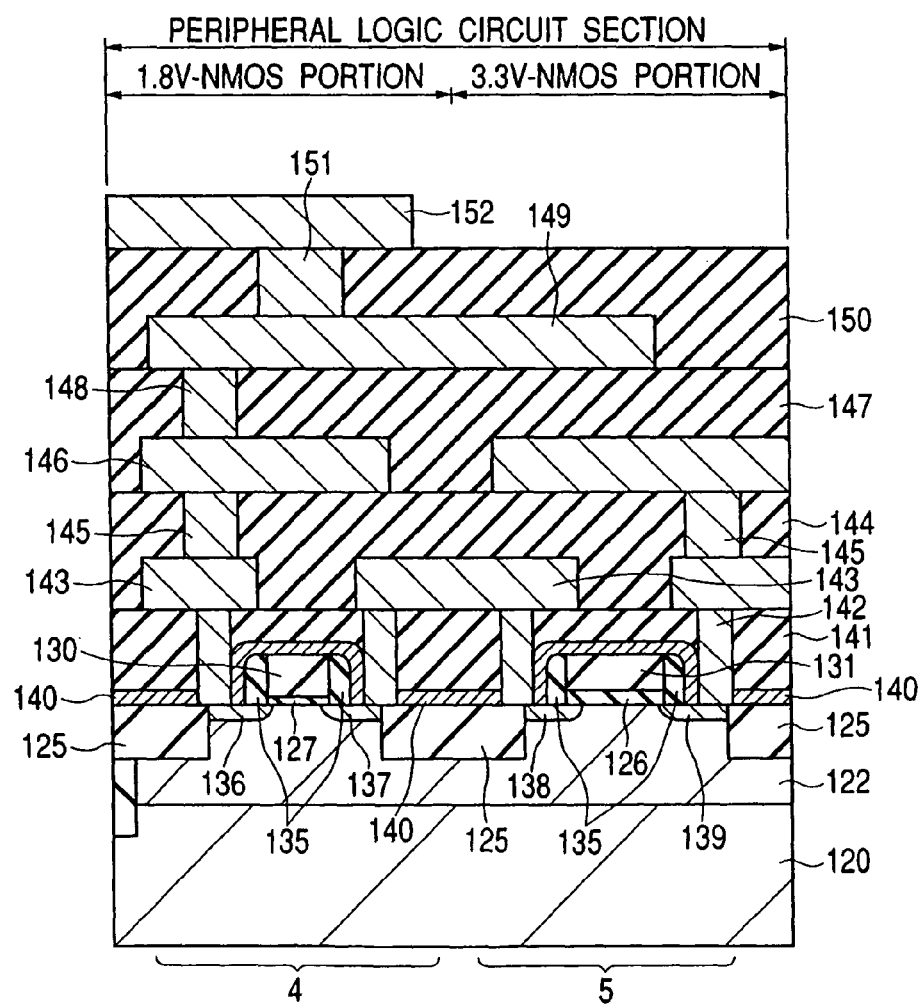
FIG. 17 is a vertical cross-sectional view of a device structure, which shows one embodiment illustrative of a logic circuit and an external input/output circuit formed on a semiconductor chip that constitutes a semiconductor integrated circuit device according to the present invention.

A vertical cross-sectional view of a device structure, which shows one embodiment illustrative of a logic circuit and an external input/output circuit formed on a semiconductor chip that constitutes a semiconductor integrated circuit device according to the present invention, is illustrated in FIG. 17. A p type well region 122 having a depth of 0.8 μm is formed on a p type silicon substrate 120 having a resistivity of 10 Ωcm. An n channel type transistor (also called "MOSFET" or "MISFET") operated at a source voltage of 1.8V, which is separated by device or element isolation regions 125, is formed, within the p type well region 122, of an n type drain region 137, an n type source region 136, a thin gate oxide film 127 having a thickness of 4 nm, and a gate electrode 130 having a gate length of 0.2 μm, which comprises an n type polysilicon film having a thickness of 0.2 μm.

Within the p type well region 122, an n channel type transistor 5 operated at a source voltage of 3.3V, which is separated by the device isolation regions 125, is formed of an n type drain region 139, an n type source region 138, a gate oxide film 126 having a thickness of 8 nm, and a gate electrode 131 having a gate length of 0.4 μm, which comprises an n type polysilicon film having a thickness of 0.2 μm. Although not shown in the drawing, a p channel type transistor, which constitutes a CMOS circuit in combination with the n channel type transistor, is configured by forming an n type well region on the p type silicon substrate 120 and forming a p type source region and a drain region therein.

A silicon nitride film 140 having a thickness of 100 nm, which is deposited by a CVD method, is disposed over the transistors 4 and 5 for the formation of self-alignment contacts. Further, there are provided contact plugs 142 provided at desired positions of a contact interlayer film 141 having a thickness of 1 μm, which is flattened by a CMP method, a first metal wiring 143 comprising an aluminum film having a thickness of 0.5 µm, first interlayer plugs 145 provided at desired positions of a first interlayer film 144 having a thickness of 1 µm, which is flattened by the CMP method, a second layer metal wiring 146 comprising an aluminum film having a thickness of 0.5 µm, a second interlayer plug 148 provided at a desired position of a second interlayer film 147 having a thickness of 1 µm, which is flattened by the CMP method, a third layer metal wiring 149 comprising an aluminum film having a thickness of 0.5 µm, a third interlayer plug 151 provided at a desired position of a third interlayer film 150 having a thickness of 0.8 µm, and a fourth layer metal wiring 152 comprising an aluminum film having a thickness of 1 µm. The fourth layer metal wiring 152 is used even as an electrode such as a bonding pad or the like in addition to a metal wiring corresponding to a top layer.

In a system LSI wherein a plurality of circuit blocks such as a memory circuit, an external input/output device, etc. that constitute peripheral circuits of a CPU (Central Processing Unit) with the CPU as the center, constitute a one-chip microcomputer or the like formed on a single semiconductor substrate, the thickness of a gate oxide film for each MIS (MOS) transistor is classified into two types. In the case of circuits each of which needs to ensure a certain degree of withstand voltage (withstand voltage to breakdown of gate oxide film) with respect to an operating voltage of each MIS transistor, e.g., ones using DRAMs as an external input/output circuit, an analog input/output circuit and a memory circuit, an address selection MOSFET of each memory cell, an analog/digital converter, a digital/analog converter, etc. respectively have, although not restricted in particular, MIS transistors having a gate length of 0.4 µm and a gate oxide film thickness of 8 nm where a 0.2-µm process technology is used. On the other hand, circuits each operated with a stepped-down relatively low internal voltage as an operating source, i.e., a logic circuit, an SRAM, and a CPU respectively comprise MIS transistors each having a gate length of 0.2 µm and a gate oxide film thickness of 4 nm.

FIGS. 18 and 19 are respectively cross-sectional views of the device structure, for describing one embodiment of a method of manufacturing rewirings for a semiconductor integrated circuit device according to the present invention. FIG. 18(A) shows a cross-section of a wafer which is in a state in which bonding pads 202 (202a and 202b) are formed on the surface of a semiconductor chip 201 in which a large number of circuit elements are formed on a semiconductor substrate, and which is covered with a protective layer 203 except for openings for the bonding pads 202. One shown in the same FIG. (A) is equivalent to the stage of completion of the conventional wire bonding connecting wafer.

As shown in FIG. 18(B), a lower insulating layer 204 is formed on the surface of the wafer. Portions of the bonding pads 202 (202a and 202b) are opened or defined in such a lower insulating film 204.

As shown in FIG. 18(C), a rewiring 205 is formed up to a position to form each bump electrode as viewed from the bonding pad 202a, and at the same time a rewiring layer 295 is formed even with respect to the pad 202b dedicated for detection.

As shown in FIG. 18(D), a surface insulating layer 206 is formed, and immediate upper portions of the bonding pads 202 (202a and 202b) at the rewiring layers 205 and 295, and a portion for forming each bump electrode are exposed.

Further, as shown in FIG. 19(E), an under bump-electrode metal or metallurgy 207 is formed in the bump electrode forming portion, and under bump metallurgy layers 297 are simultaneously formed over the bonding pads 202 (202a and 202b). The under bump metallurgy layers 297 just or directly over the bonding pads 202 (202a and 202b) formed in the above-described manner result in a testing pad 209a corresponding to each power or signal input/output bonding pad 202a, and a testing pad 209b corresponding to each test-dedicated bonding pad 202b.

As shown in FIG. 19(F), the leading ends of probes 211 are brought into contact with their corresponding testing pads 209a and 209b to perform a probe test, whereby the relief of each defective product by use of the redundancy of a circuit, the selection of functions, the sorting of non-defective products and defective products, etc. are executed.

As shown in FIG. 19(G), a bump electrode 208 is formed on the under bump metallurgy 207 by solder, and the completed wafer is cut so as to be separated into each individual chips (dicing), thereby obtaining flip-chip type semiconductor integrated circuit devices. While aluminum or an aluminum alloy is normally used as a material for the bonding pad 202 or its surface, copper or another metal may be used according to the type of a wiring material used inside a semiconductor elemental device.

In addition to inorganic films such as a silicon oxide film, a silicon nitride film, etc., an organic film like polyimide, and a combination of these are used as the material for the protective layer 203. The material for the lower insulating layer 204 may preferably use organic materials or substances having low elastic modulus (low modulus of elasticity) and low permittivity, like polyimide, a fluorocarbon resin, various elastomer materials to relax a stress (state of stress/distortion) which acts on the bump electrode 208 due to the difference in thermal expansion between a semiconductor integrated circuit device and a printed circuit board after the implementation of the substrate, and reduce the capacitance of the relocation wiring 205. Here, as the elastomer materials, may be mentioned, for example, silicon and acrylic rubber materials, a polymeric material having low elastic modulus, which has blended these rubber materials, etc.

The lower insulating layer 204 is formed by spin coating using varnish, printing or film bonding. The thickness of the lower insulating layer 204 may preferably be about 3 µm or more from the viewpoint of the stress and the reduction in capacitance. However, when the organic film is used for the protective layer 203, the lower insulating layer 204 is made thinner than it or may be omitted.

A three-layer wiring structure wherein a chromium, titanium, nickel, a nickel alloy or the like having a thickness of from about 0.1 µm to about 0.5 µm is stacked or layered on the upper and lower surfaces of copper or a steel alloy having a thickness of about 1 µm to about 5 µm, for example, is used for the relocation wiring 205. Further, aluminum and its alloy may be used therefor.

Organic materials having low elastic modulus, like polyimide, an epoxy resin, a fluorocarbon resin, and various elastomer materials may preferably be used as the material for the surface insulating layer 206 to relax the stress which acts on the bump electrode 208. A flexible one may be used as the insulating film (further insulating film) below the rewiring to absorb the stress that acts on the bump electrode. The upper insulating film 206 may select a material relatively harder than the lower insulating film 204 from the viewpoint of its protection. Described specifically, the upper insulating film 206 and the lower insulating film 204 are respectively formed of a photosensitive polyimide resin film. The amount of a solvent, molecular weight, the content of a filler, etc. prior to heat treatment (cure) are changed to thereby make it possible to change the final hardness (elastic modulus) of the film thereof. Further, the upper and lower insulating films may be formed of materials different from each other. In this case, the upper insulating film 206 and the lower insulating film 204 are considered to be formed of, for example, an epoxy resin and a polyimide resin respectively.

As the under bump metallurgy 207, a metal having a high solder barrier property, such as chromium, nickel, nickel/tungsten, nickel/copper or the like may preferably be formed with a thickness of about 0.3 μm to about 3 μm. Further, a golden thin-film layer having a thickness of about 0.1 μm may preferably be formed on the surface thereof to ensure wettability of solder and electrical connectability to each probe. The solder bump electrode 208 can be formed by printing solder paste on the under solder bump metallurgy 207 or transferring a solder ball molded to a predetermined size in advance and thereafter effecting reflow on it.

The testing pads 209 are provided just or directly over both of the power-supply or signal input/output bonding pad 202a and the bonding pad 202b for probe testing, thereby making it possible to execute the probe test after the rewiring process. It is therefore possible to prevent degradation in connection reliability due to damage of each bonding pad 202 prior to the rewiring process. Particularly when the rewirings are used as wirings for distributing a signal as in the present embodiment, the probe test thereof becomes important.

Since an inspection is done without applying the probe 211 to the already-formed solder bump electrode 208 in the above configuration, the solder bump electrode 208 can be prevented from deforming. It is also possible to prevent damage of the probe 211 due to the application of the probe decentered to a curved surface of the solder bump electrode 208 to the solder bump electrode 208.

It is not necessary to apply the probe 211 to the under solder bump metallurgy 207 antecedent to the formation of the solder bump electrode 208 in the above configuration. Therefore, there is no fear that the layer for enhancing solder wettability, such as gold or the like formed on the surface of the under solder bump metallurgy 207, and the solder barrier metal layer placed below the layer are endamaged, thus making it possible to prevent degradation in connection reliability to solder.

In the above-described configuration, owing to the arrangement of the testing pads 209 in a row, an inexpensive cantilever type probe can be used as the probe 211 as shown in FIG. 19(F). Further, since the bonding pads 202 on the normal wire-bonding wafer with no rewirings applied thereto, and the testing pads 209 described in the present embodiment are identical to one another in position within a chip plane, the normal wire-bonding wafer and the probe 211 can also be shared therebetween.

Since the testing pads 209 enter into projected areas of the bonding pads 202 in the aforementioned flip-chip type semiconductor integrated circuit device, an increase in capacitance due to the addition of the testing pads 209 is next to nothing. Incidentally, owing to the provision of only the testing pads 209 without providing the bump electrodes for some bonding pads 202b, the probe test can be executed after the rewiring process without increasing the number of solder bumps.

Figure 20:
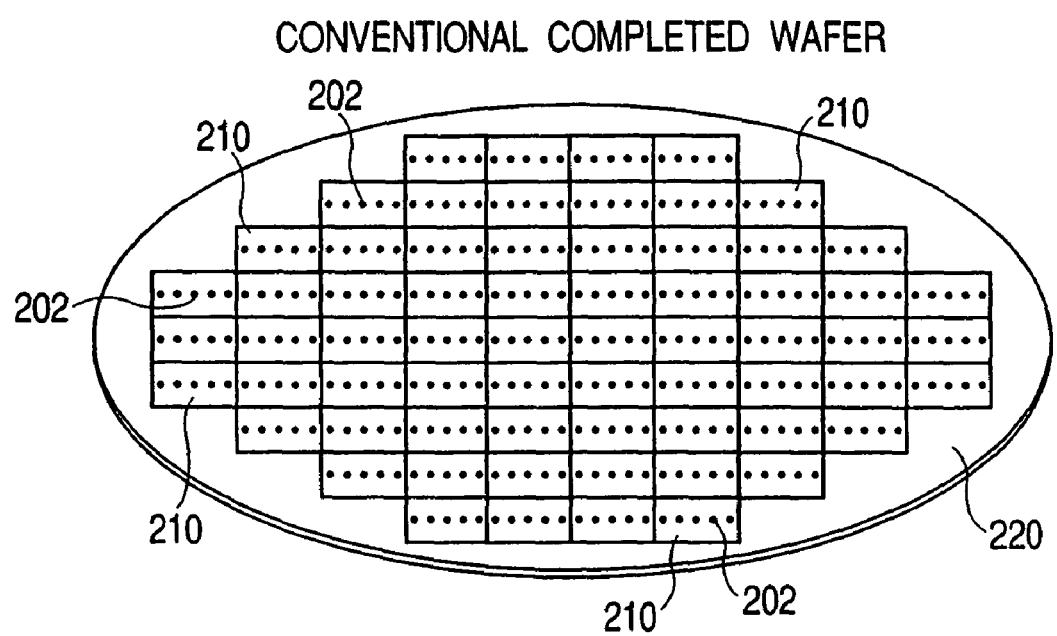
FIG. 20 is a perspective view at one step, for describing a manufacturing process of a flip-chip semiconductor integrated circuit device according to the present invention.

Processes for manufacturing a flip-chip type semiconductor integrated circuit device according to the present invention are shown in FIGS. 20 through 24 every stages in the form of perspective views. FIG. 20 shows a completed stage of a conventional wire bonding connecting wafer. Namely, FIG. 20 is a view showing the whole span of a wafer 220 placed in the state shown in FIG. 18(A). The bonding pads 202 are respectively formed in respective chips 210.

Figure 21:
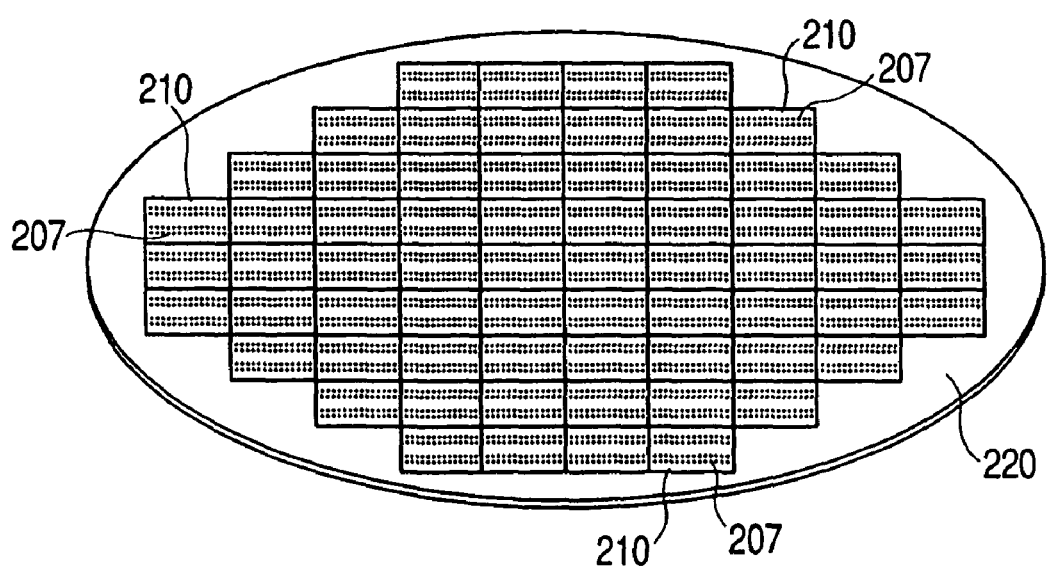
FIG. 21 is a perspective view at another step, for describing the manufacturing process of the flip-chip semiconductor integrated circuit device according to the present invention.

In order to manufacture the flip-chip type semiconductor integrated circuit device, lower insulating layers 204, rewirings 205, surface insulating layers 206 and under bump metals or metallurgies 207, etc. are formed on the wafer 220 shown in FIG. 20 as illustrated in FIGS. 18(B), 18(C) and 18(D) and 19(E) by way of example. Thus, such a wafer 220 as shown in FIG. 21 placed in a state in which the under bump metallurgies 207 are formed, is obtained. The state of FIG. 21 is equivalent to the state of FIG. 19 as viewed in the form of a cross-section.

Figure 22:
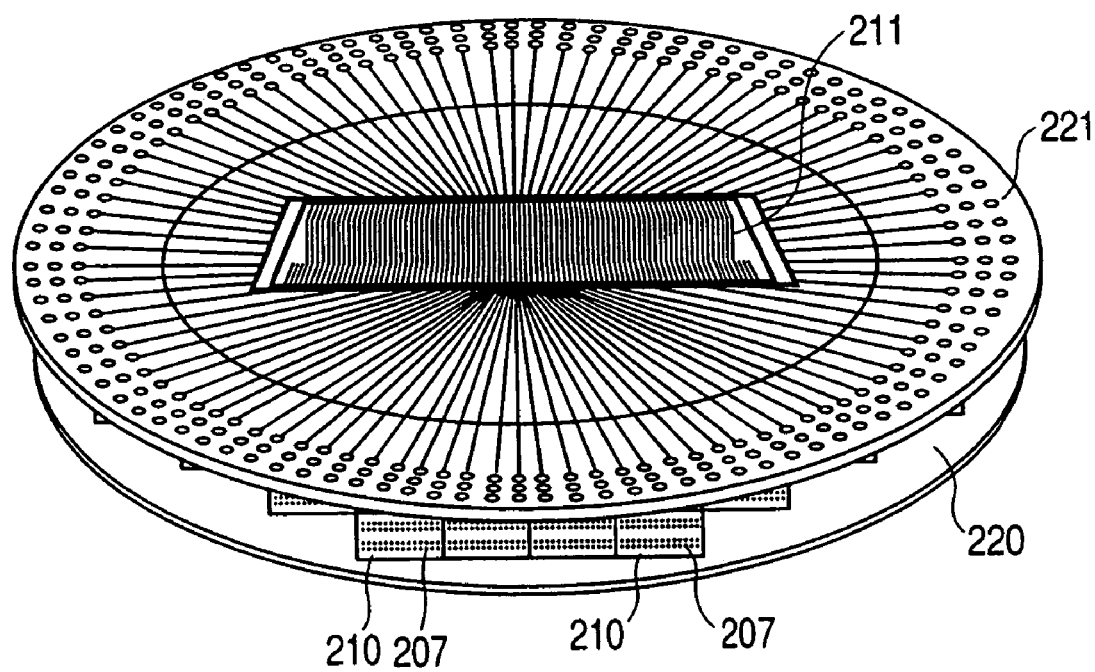
FIG. 22 is a perspective view at a further step, for describing the manufacturing process of the flip-chip semiconductor integrated circuit device according to the present invention.

Next, as shown in FIG. 22, a plurality of probes 211 are positioned so that their leading ends or tips are simultaneously brought into contact with a plurality of testing pads 209 (unillustrated in FIG. 22) on the wafer 220. In this condition, probe tests are carried out through the use of a fixed probe card 221. The plurality of probes 211 are simultaneously brought into contact with the plurality of testing pads 209 to thereby simultaneously test or inspect the testing pads 209 corresponding to one chip 210 or plural chips 210 and inspect them while their contact positions are being shifted successively, whereby the probe tests are effected on all the chips 210 on the wafer 220. At this time, the selection of functions and the relief of defects can be performed simultaneously or successively by using the same or similar another probe card 221.

A process for forming solder bump electrodes will next be explained by reference to FIG. 23 with a solder paste printing system as an example. A solder printing mask 222 in which openings 223 are defined in association with the layouts of under bump metallurgies 207 on the surface of a wafer 220 as shown in the drawing, is superimposed on the wafer 220 in alignment with it, and solder paste 225 is printed thereon by a squeegee 224. In a state placed immediately after the printing, the solder paste 225 is evenly printed on an area slightly wider than the under bump metallurgies 207 as shown by a cross-sectional view in the drawing. When this wafer is reflow-heated to melt the solder paste 225, solder is aggregated spherically to form solder bump electrodes 208.

The wafer 220 subsequent to the formation of the bump electrodes 208 is cut and separated into pieces of chips 210 by a dicing blade 226 as shown in FIG. 24, whereby completed products each corresponding to the flip-chip type semiconductor integrated circuit device can be obtained. The completed products are further subjected to a burn-in inspection and various final inspections for their performance, external appearance, etc. as needed. After they are subjected to predetermined markings and packaged, they are shipped or delivered.

Figure 25:
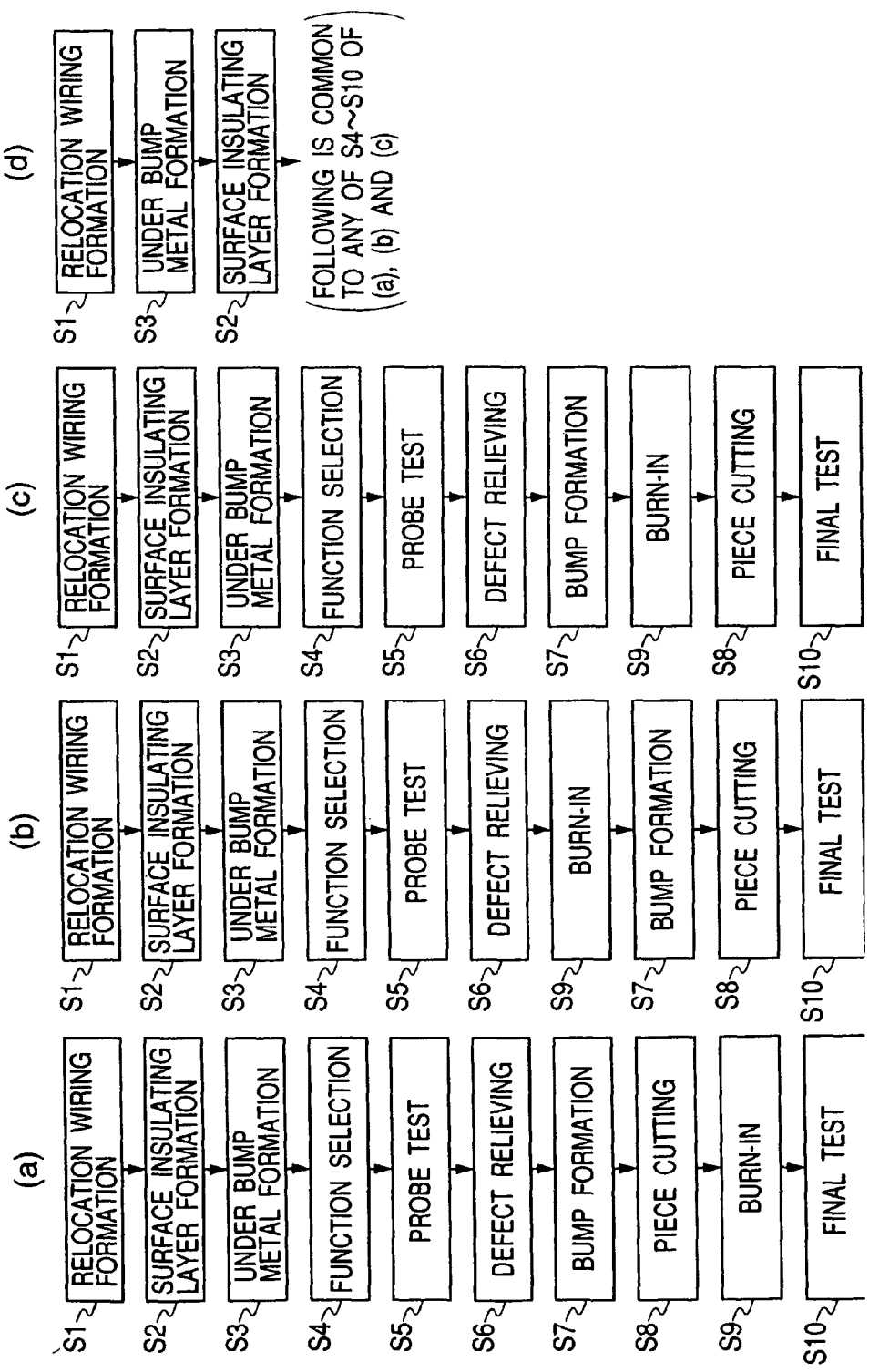
FIG. 25 is a flowchart for describing manufacturing process flows subsequent to a rewiring forming process step employed in the flip-chip semiconductor integrated circuit device according to the present invention.

FIG. 25 shows manufacturing process flows subsequent to a rewiring forming process of a flip-chip type semiconductor integrated circuit device according to the present invention in the form of four types of (a), (b), (c) and (d). If the structure shown in FIG. 19(G) is taken as one example, then the manufacturing flows shown in the same drawing include respective process steps: a rewiring forming S1 for forming each rewiring 205 on an insulating layer 204, a surface insulating layer forming S2 for forming such an insulating layer as designated at numeral 206, an under bump metallurgy forming S3 for forming such an under bump metallurgy as designated at numeral 207 and an under metallurgy 297 for each testing pad 209, etc., a function selecting S4 like mode stetting based on the program for the antifuse 1, a probe testing S5, a defect relieving S6 like defective-bit replacement based on the program for the antifuse 1, a bump forming S7 for forming each bump electrode, a piece cutting (dicing) S8 for cutting out chips from a wafer, a burn-in S9, and a final testing S10.

The manufacturing flow shown in FIG. 25(a) corresponds to the burn-in S9, i.e., a manufacturing flow for performing a continuous operation test at a high temperature in chip units after the completion of the piece cutting S8. Since the interval between solder bump electrodes is made wider than the interval (of about 60 μm to about 150 μm) between bonding pads by each rewiring in the flip-chip type semiconductor integrated circuit device (about 0.5 mm to about 1.0 mm), the burn-in in each chip unit can easily be carried out through the use of each burn-in socket employed in a BGA (Ball Grid Array) type CSP (Chip Size Package). Namely, the bump electrodes are formed on the chip in advance prior to the burn-in step, and arrangement patterns for the bump electrodes are respectively associated with electrode arrangement patterns for the burn-in sockets. Thus, since it is not necessary to newly prepare custom-engineered burn-in sockets, the cost for the assembly of the flip-chip type semiconductor integrated circuit device can be reduced.

Even when the burn-in sockets with the bump electrodes used as connecting terminals are not used, electrical connections for burn-in can be preformed by use of the testing pads 209. In this case, narrow-pitch type expensive burn-in probes capable of probing are necessary for the testing pads placed between the bump electrodes, whereas the deformation of each solder bump electrode 208 due to socket contact at a high temperature can be prevented.

In the manufacturing flows shown in FIGS. 25(b) and 25(c), the burn-in S9 are carried out in a wafer stage before the piece cutting S8. In particular, FIG. 25(b) is a manufacturing flow for performing burn-in before the formation of the solder bump electrodes by use of the testing pads 209 or the under bump metallurgies 207 antecedent to the formation of the solder bump electrodes 208. Since the electrical connections for burn-in are performed without having to use the bump electrodes, it is possible to prevent the deformation of each solder bump electrode due to the contact of each burn-in socket under a high-temperature environment. Further, since the burn-in is performed in a flat stage antecedent to the formation of each solder bump electrode, a burn-in probe like a socket can easily be applied to each testing pad 209 without bringing the solder bump electrodes 208 into obstacles. Since the burn-in is done in the wafer stage, a plurality of chips can be subjected to burn-in in a lump and throughput for testing can be improved.

FIG. 25(c) shows a manufacturing flow for performing burn-in after the formation of the solder bump electrodes. The burn-in probe is brought into contact with each solder bump electrode 208. When the burn-in probe is brought into contact with the solder bump electrode 208, the solder bump electrode 208 is easy to deform upon burn-in. However, there is in no danger of endamaging each under bump metallurgy 207 or developing a surface deterioration in the under bump metallurgy 207. It is thus possible to form high-reliable under bump metallurgies and rewirings. Since the burn-in is performed in the wafer stage in the same manner as FIG. 25(b) even in this case, throughput for testing can be improved.

The manufacturing flow shown in FIG. 25(d) is a manufacturing flow in which the steps corresponding to the surface insulating layer forming S2 in the respective flows shown in FIGS. 25(a) through 25(c) are replaced by a step corresponding to an under bump metallurgy forming S3. Process steps subsequent to a function selecting step are common to any of the manufacturing flows shown in FIGS. 25(a) through 25(c). The relationship between FIGS. 25(a) through 25(c) and FIG. 25(d) is as follows. Since the rewiring 205 and the under bump metallurgy 207 are formed in the same process under the manufacturing flow shown in FIG. 25(d), the cost for the formation of the under bump metallurgy can be reduced as compared with the manufacturing flows shown in FIGS. 25(a) through 25(c).

When circuit elements of a semiconductor integrated circuit device are manufactured in a fully-established process and percent defective is low, the burn-in might be omitted. In this case, the respective manufacturing flows shown in FIGS. 25(a) through 25(c) are precisely identical to one another and hence there is no difference.

In any of the respective manufacturing process flows shown in FIG. 25, the function selecting S4, the probe testing S5 and the defect relieving S6 are carried out in succession. When an antifuse is used in the function selecting S4 and the defect relieving S6, any of these three steps can be performed by bringing each probe into contact with the wafer and thereby performing electrical processing (unaccompanied by fuse cut-out by laser and a change in rewiring) alone. Therefore, the three steps can be processed in a batch with one probing (i.e., without performing probing again after probing on other chips), and hence the processes can be simplified. In this case, the function selection and the defect relief can also be considered with being included in a broad probe test.

In any of the respective manufacturing process flows shown in FIG. 25, the solder bump electrode forming S9 are collectively carried out in the wafer stage antecedent to the piece cutting S8. Thus, the solder bump electrodes can be formed efficiently as compared with the conventional BGA and CSP manufacturing processes for forming the solder bump electrodes every piece chips. Further, the execution of the three steps of the function selecting S4, probe testing S5 and defect relieving S6 prior to the solder bump electrode forming S7 makes it possible to easily perform probing without protrusions from the solder bumps being taken as obstacles.

The function selecting S4 can also be carried out after the probe testing S5 or the defect relieving S6. However, if the function selecting S4 is executed prior to the probe testing S5, then only a pre-selected function may be tested upon the probe testing S5. It is therefore possible to reduce inspection items and improve inspection efficiency. The function selection may be carried out by means of the rewiring. Namely, the processes up to the formation of each circuit on the wafer are set identical, and such a conventional bonding option that the bit configuration is set to ×16 bits, ×32 bits or ×64 bits or the like according to the rewiring forming process in the example of the DRAM, may be executed by use of the rewirings.

The rate of demand between respective types obtained according to the function selecting S4 always changes according to the market situation. Thus, it is desirable to prepare stock in a state prior to the function selection for the purpose of performing flexible support for the demand change and minimizing the amount of stock every types. It is also desirable to cope with a step subsequent to the function selection in as short periods as possible. Owing to the use of an antifuse for function selection, the same rewiring patterns can be taken over all the types and the stock can be kept in a state placed immediately before the formation of each bump electrode. Thus, the required types can be manufactured in a short period according to the change in demand, and the amount of the stock can be reduced.

In regard to the manufacturing flows described in FIG. 25, the function selecting S4 based on the program element can be performed after the bump electrode forming S7 contrary to the above. In this case, it is necessary to expose electrodes for respectively applying voltages to program elements onto the surface of a semiconductor integrated circuit device for the purpose of the function selection in a manner similar to projecting or protruding electrodes. However, since each individual semiconductor integrated circuit devices can be stocked in a state in which the wafer process has virtually been finished, except for a process attendant on the function selection, stock management is easy.

Figure 26:
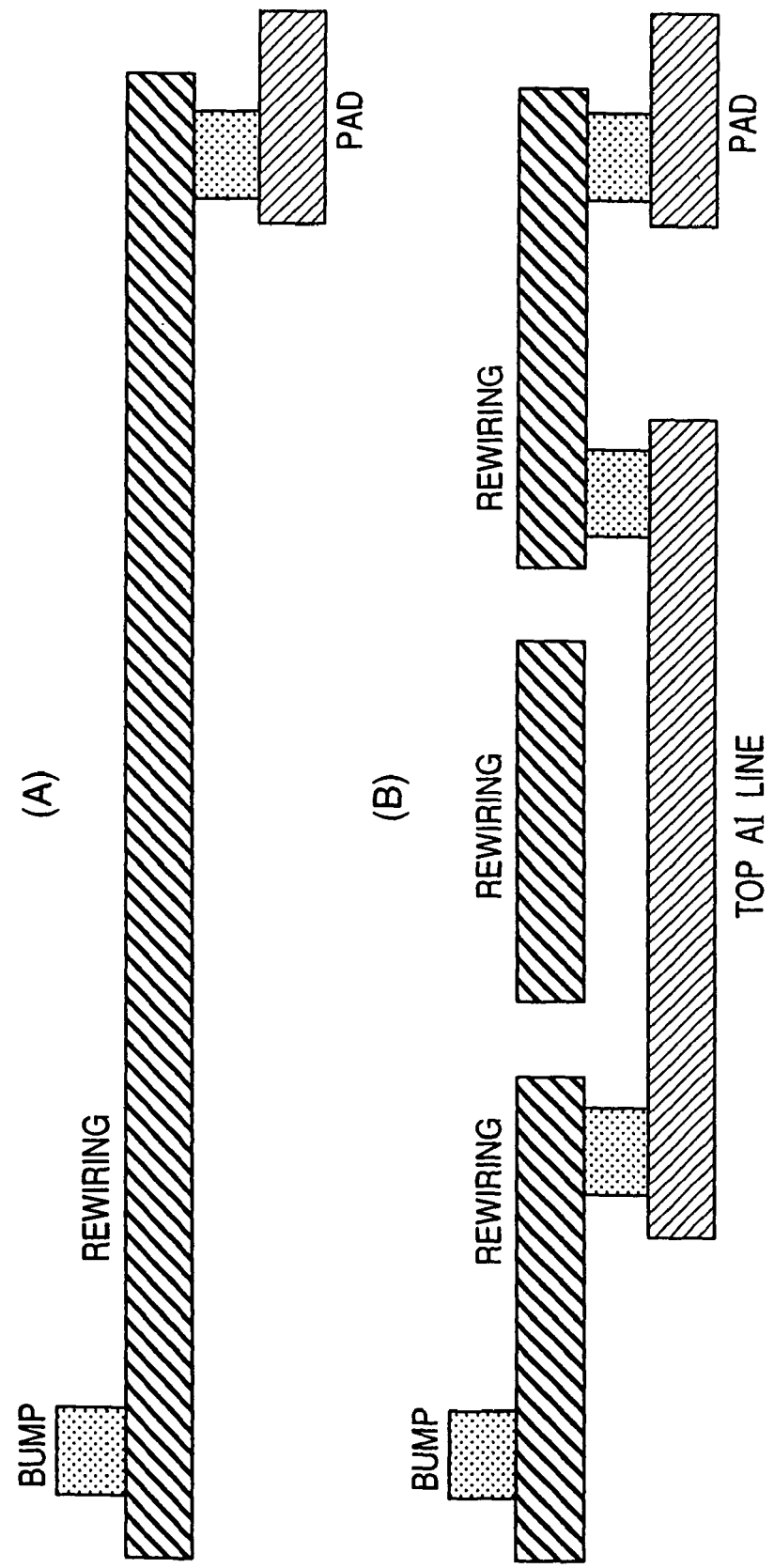
FIGS. 26(A) and 26(B) are schematic cross-sectional views showing a still further embodiment of a semiconductor integrated circuit device according to the present invention.

A schematic cross-sectional view of a still further embodiment of a semiconductor integrated circuit device according to the present invention is shown in FIGS. 26(A) and 26(B). Unillustrated circuit elements and wirings are formed on one main surface side of such a semiconductor chip as described above. Of the wirings, each pad is formed of the wiring lying in the top layer. The pad is connected to its corresponding bump electrode by a rewiring used as a conductive layer as described above. While omitted in the same drawing, an organic insulating film corresponding to a first layer formed of polyimide is formed in a manner similar to the embodiment shown in FIG. 1 except for openings for the pads formed thereat. Further, rewirings are formed on the organic insulating film.

In the present embodiment, FIG. 26(A) is different from the embodiment shown in FIG. 1. One bump electrode and one pad are connected to each other by a rewiring. On the other hand, rewirings shown in FIG. 26(B) are provided so as to intersect the rewiring shown in FIG. 26(A) although not restricted in particular. The rewiring connected to the pad and the rewiring connected to the bump side are connected to each other at the intersecting portion by means of a wiring such as the top Al (Aluminum) line formed in the same process as the pad. Therefore, the rewiring shown in FIG. 26(A) is provided on the unillustrated organic insulating film corresponding to the first layer on the top layer Al line for connecting the two rewirings.

As to the rewirings employed in the present embodiment, in addition to the rewiring for connecting the pad and the bump in a one-to-one correspondence as shown in the drawing, the rewiring provided so as to intersect on the top Al line in FIG. 26(B) by way of example may be a rewiring used as some of a signal line or a power supply line in a manner similar to the embodiment shown in FIG. 11, e.g., it may be a signal wiring for connecting a pad and a pad or a source or power wiring for connecting a bump and a bump.

Figure 27:
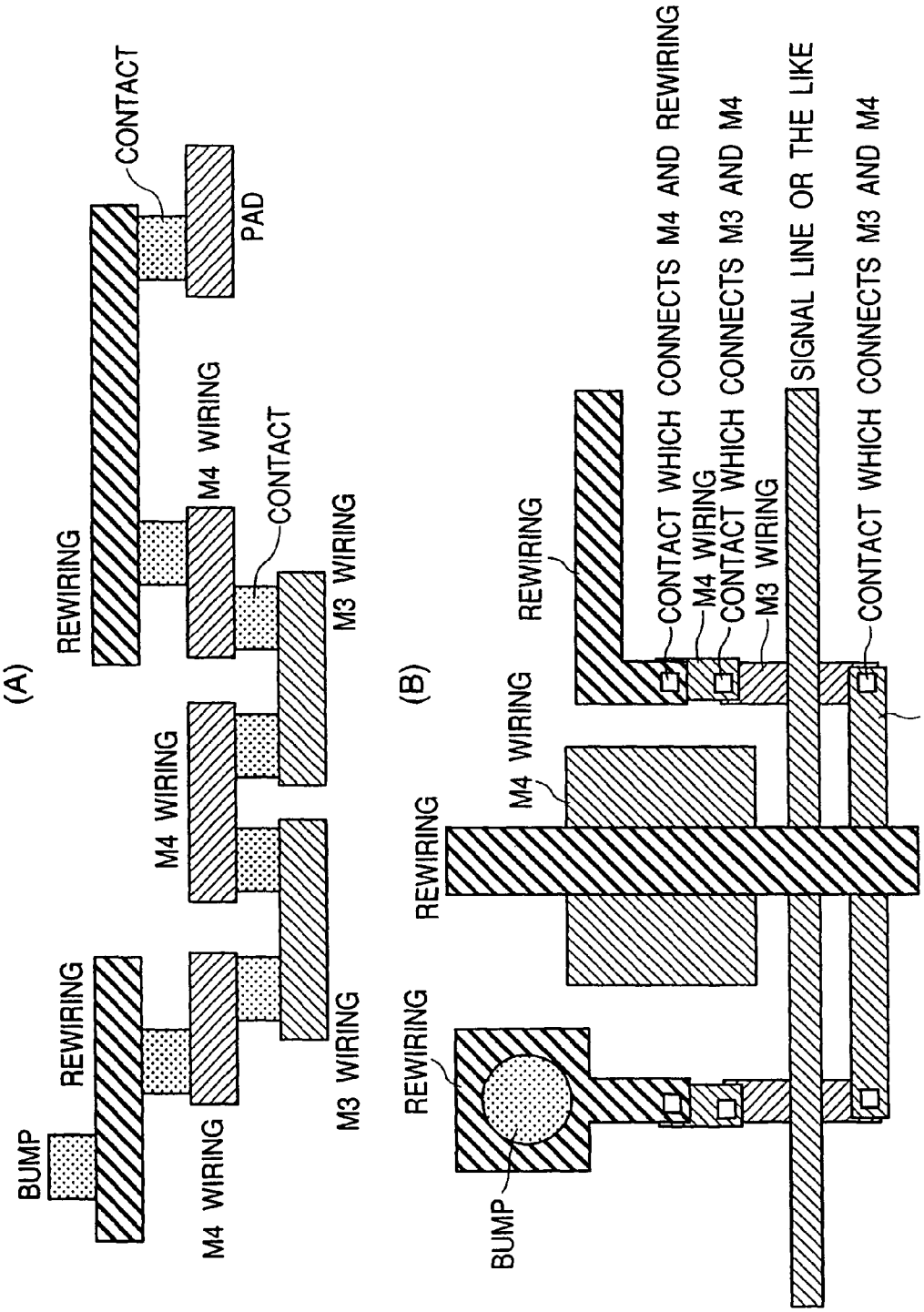
FIGS. 27(A) and 27(B) are schematic configurational views illustrating a still further embodiment of a semiconductor integrated circuit device according to the present invention.

A schematic configurational view of a still further embodiment of a semiconductor integrated circuit device according to the present invention is shown in FIGS. 27(A) and 27(B). FIG. 27(A) shows a schematic sectional structure thereof, and FIG. 27(B) shows circuit patterns, respectively. The present embodiment illustrates a modification of the embodiment shown in FIGS. 26(A) and 26(B). Wirings formed on one main surface side of a semiconductor chip, which connect rewirings to each other, are utilized in combination with wirings placed below the top layer (M4), e.g., wirings M3 each corresponding to a third layer in addition to the top layer (M4).

Where a rewiring extended so as to intersect as shown in FIG. 27(B), and a signal line or the like formed by the top layer M4 extended in parallel in a bump-to-pad connecting direction are provided between a bump and a pad when the bump and pad are connected to each other as shown in FIG. 27(A) by way of example, wirings M3 each corresponding to a third layer provided therebelow are further used to form portions which intersect the M4.

According to FIG. 27(A), the pad is connected to one end of the Corresponding rewiring by a contact. The other end of the rewiring is connected to one end of the corresponding M4 wiring by a contact, and the other end of the M4 wiring is connected to one end of the corresponding M3 wiring by a contact. The other end of the M3 wiring is connected to one end of its corresponding M4 wiring by a contact. Consequently, first intersection is made to the signal line or the like. The other end of the M4 wiring is connected to one end of the corresponding M3 wiring by a contact at the portion intersecting the signal line or the like. The other end of the M3 wiring is connected to one end of the corresponding M4 wiring by a contact. By connecting the other end of the M4 wiring to its corresponding rewiring connected to the bump, the pad and bump are electrically connected to each other. Incidentally, the other wiring (M4) and the rewiring at the intersecting portion are omitted from FIG. 27(A).

Figure 28:
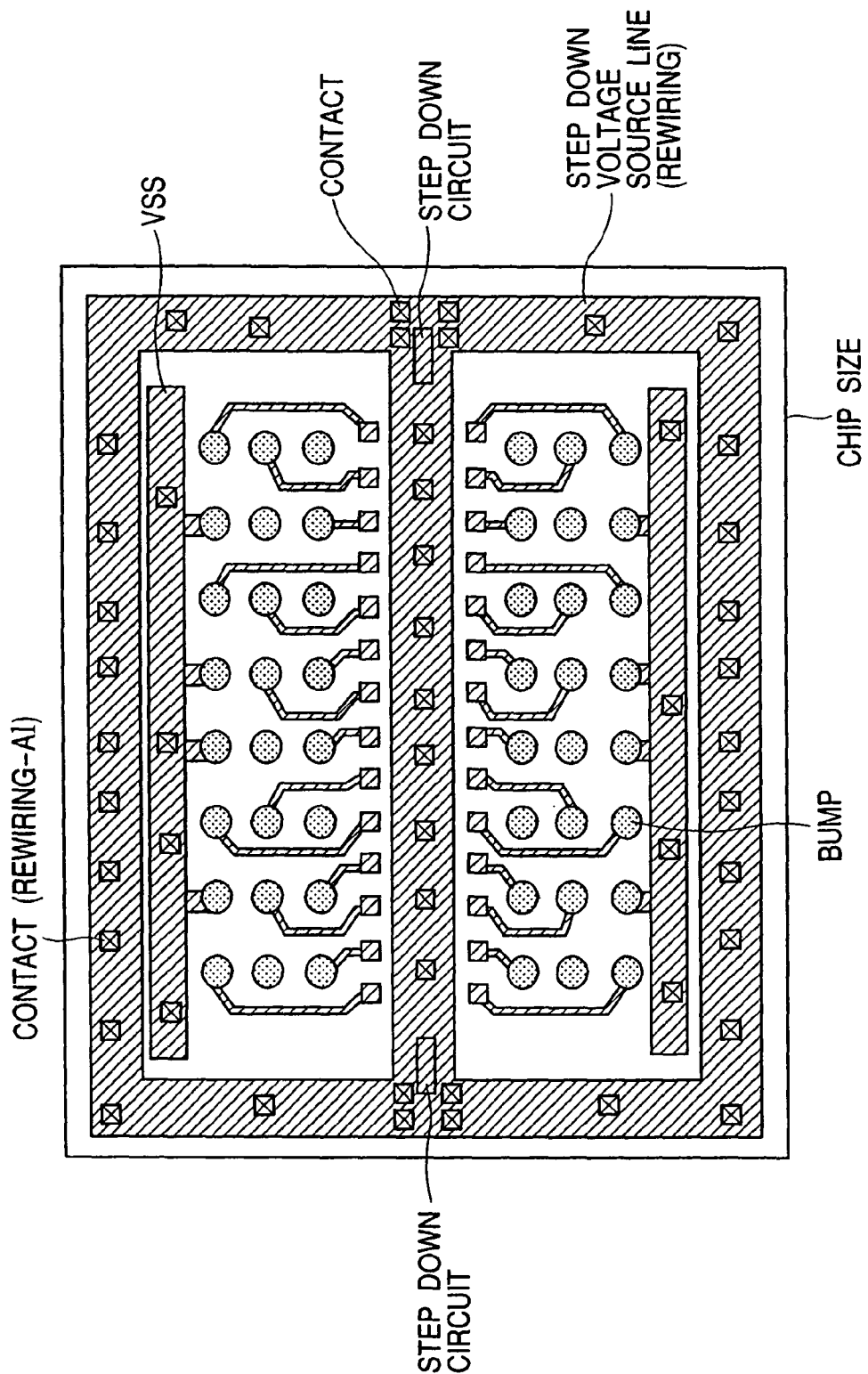
FIG. 28 is a plan view showing a still further embodiment of a semiconductor integrated circuit device according to the present invention.

A plan view of a still further embodiment of a semiconductor integrated circuit device according to the present invention is shown in FIG. 28. Although not restricted in particular, the semiconductor integrated circuit device showing the present embodiment is intended for a memory circuit like a static RAM. A layout of rewirings, and bump electrodes and pads connected thereto is shown therein.

In a manner similar to the above even in the same drawing, the bump electrodes are respectively indicated by ○ and the pads are respectively indicated by small □. These bump electrodes and pads are interconnected with each other by their corresponding rewirings. Even in the present embodiment, the rewirings are divided into two types for a DC voltage and an AC signal according to the functions thereof. The rewirings for the AC signal are identical to the rewiring employed in the wafer/level CSP and connects one bump electrode and one pad to each other in a one-to-one correspondence. Each wiring is used for the input of an address and a control signal and the input/output of data. These rewirings for the signals are reduced in parasitic capacity and make use of rewiring layers each having a wiring width relatively formed thin in association with a plurality of pads provided in high density in order to transfer signals transmitted through the rewirings at high speed.

Even in the present embodiment, the rewiring layer is used to enable the supply of power under low impedance. In the same drawing, a rewiring layer having a thick wiring width, which extends along a central portion of a semiconductor chip and a peripheral portion thereof, is provided to supply a stepped-down voltage formed by an internal step down circuit. Stepped-down voltages formed by the debooster voltage circuits provided at both the right and left ends of the central portion of the chip are supplied to the rewiring layer and distributed to the periphery of the chip by contacts as operating voltages for internal circuits. When the source voltage is set as 3.3V, for example, the stepped-down voltage is given as a low voltage like 1.5V.

Two rewirings provided inside the step down voltage source line, which extend along the longitudinal direction of the chip, are provided to supply a circuit ground potential VSS. Incidentally, a source or power supplied from outside is transferred to the step down circuit by unillustrated bumps and rewirings. Incidentally, when input/output interfaces operated by the external source or power exist, they are supplied with power by the bumps, rewirings and internal wirings. Since these configurations are similar to the embodiment shown in FIG. 14, they will be omitted.

Figure 29:
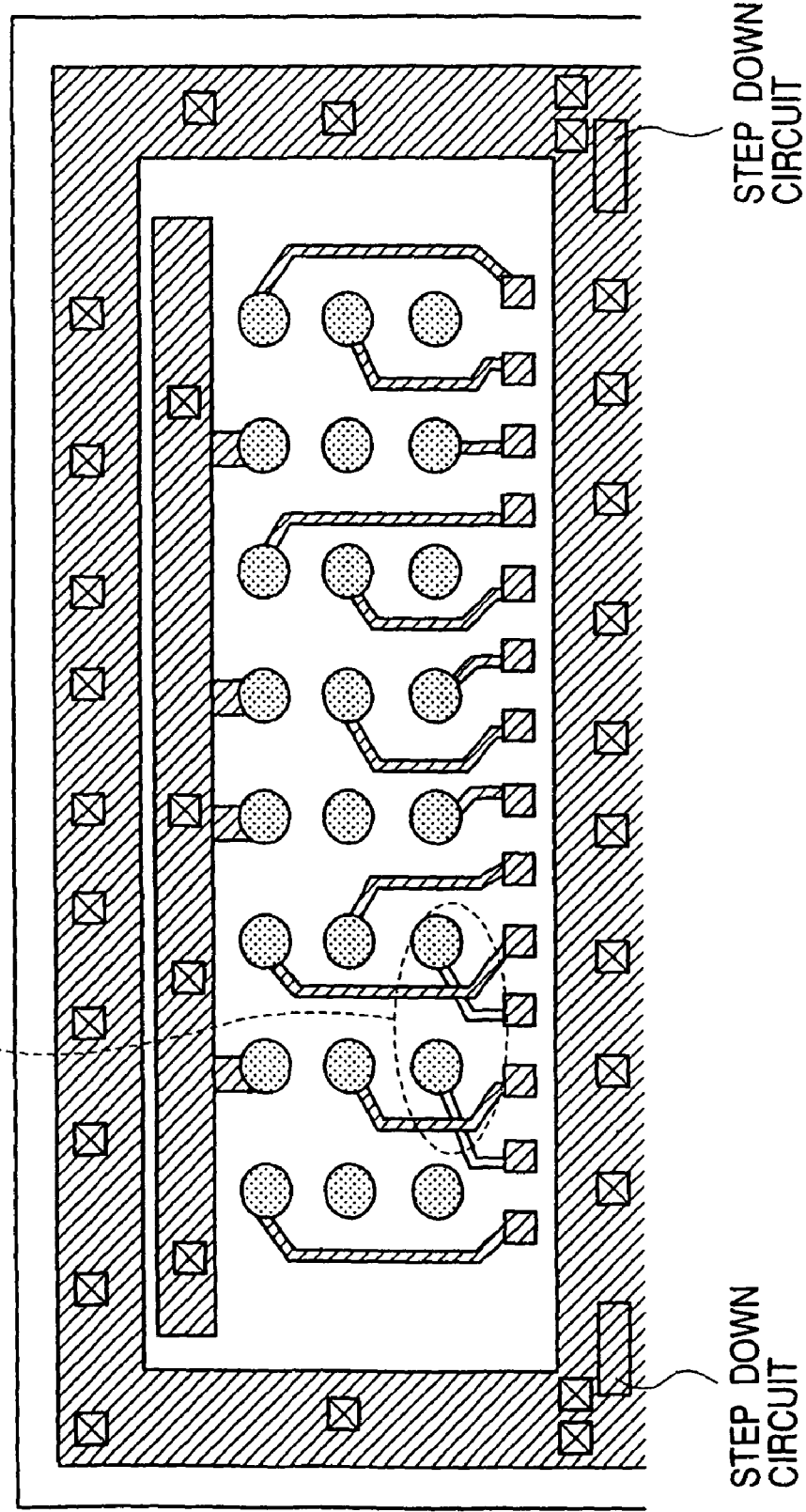
FIG. 29 is a plan view showing a still further embodiment of a semiconductor integrated circuit device according to the present invention.

A plan view of a still further embodiment of a semiconductor integrated circuit device according to the present invention is shown in FIG. 29. The semiconductor integrated circuit device showing the present embodiment is a modification of the embodiment shown in FIG. 28. The half of the memory chip shown in FIG. 28 is shown in the same drawing in enlarged form. Although not restricted in particular in the present embodiment, rewirings for connecting one bump electrodes and one pads in one-to-one correspondences are caused to intersect each other.

Owing to such intersection, a change in function or the like is performed according to a change in rewiring pattern while using the arrangement or sequence of the same bumps and pads, for example. This can provide a function equivalent to the conventional bonding option or the like, for example. Alternatively, at a specific signal, the intersecting portion described above is utilized so as to obtain a reduction in parasitic capacity and the shortest distance with a view toward transferring a signal transmitted therethrough at high speed. Such a technology of intersecting the rewirings each other can be implemented by utilizing the top wirings and their lower wirings formed on such semiconductor substrates as employed in the embodiments of FIGS. 26 and 27.

Operations and effects obtained from the above embodiments are as follows:

(1) An advantageous effect is obtained in that circuit elements and wirings constituting a circuit, and first electrodes electrically connected to such a circuit are provided on one main surface of a semiconductor substrate, an organic insulating film is formed on the circuit except for surface portions of the first electrodes, first and second external connecting electrodes are provided on the organic insulating film, and at least one conductive layer for electrically connecting the first and second external connecting electrodes and the first electrodes is mounted onto the organic insulating film, whereby such a conductive layer is available even as a satisfactory power supply path, and the degree of freedom of the layout of circuits such as a power circuit formed on the semiconductor substrate can be enhanced.

(2) An advantageous effect is obtained in that in addition to the above, the area of each of the first and second external connecting electrodes is formed so as to become larger than that of each of the first electrodes, whereby external connecting means such as bump electrodes, etc. can be obtained while bringing the elements and wirings or the like formed on the semiconductor substrate into high integration.

(3) An advantageous effect is obtained in that the conductive layer is formed of a rewiring in addition to the above, whereby a semiconductor integrated circuit device can be completed in a wafer process.

(4) An advantageous effect is obtained in that in addition to the above, the conductive layer is formed so as to be substantially identical to the length of one side of the quadrangular semiconductor substrate or longer than that, whereby a source voltage or the like can efficiently be supplied to the respective circuit elements formed on the semiconductor substrate.

(5) An advantageous effect is obtained in that in addition to the above, the same voltage is applied to the first and second external connecting electrodes to thereby enable the supply of a voltage at low impedance.

(6) An advantageous effect is obtained in that in addition to the above, a source voltage is supplied from each of the first and second external connecting electrodes to thereby enable the supply of the source voltage at low impedance, whereby the operation of the circuit formed on the semiconductor substrate can be stabilized.

(7) An advantageous effect is obtained in that in addition to the above, a circuit ground voltage is supplied to each of the first and second external connecting electrodes to thereby enable the supply of the ground voltage at low impedance, whereby the stabilization of the operation of the circuit formed on the semiconductor substrate can be achieved.

(8) An advantageous effect is obtained in that in addition to the above, second electrodes electrically connected to the circuit are further provided on the one main surface, and the first and second external connecting electrodes and the first and second electrodes are electrically connected to one another by the conductive layer, whereby a uniform voltage can stably be supplied to each circuit element formed on the semiconductor substrate.

(9) An advantageous effect is obtained in that in addition to the above, solder balls are provided for the first and second external connecting electrodes to thereby enable the manufacture thereof in a wafer process, whereby the packaging of a semiconductor integrated circuit device can be carried out simply and stably.

(10) An advantageous effect is obtained in that circuit elements and wirings constituting a circuit, and first and second electrodes electrically connected to such a circuit are provided on one main surface of a semiconductor substrate, an organic insulating film is formed on the circuit except for openings on the surfaces of the first and second electrodes, and at least one conductive layer for electrically connecting the first and second electrodes is placed on the organic insulating film, whereby the conductive layer can be used even for signal transfer, the degree of freedom of the layout of each circuit formed on the semiconductor substrate can be enhanced and the speeding up of operation can be achieved.

(11) An advantageous effect is obtained in that the conductive layer is formed of a rewiring in addition to the above to thereby enable the implementation of a high-speed signal path in a wafer process.

(12) An advantageous effect is obtained in that in addition to the above, first and second external connecting electrodes are further provided on the organic insulating film, and the conductive layer is connected to the first and second external connecting electrodes, whereby a uniform voltage can stably be supplied from the outside to the circuit elements formed on the semiconductor substrate.

(13) An advantageous effect is obtained in that the first and second external connecting electrodes are respectively configured as bump electrodes in addition to the above, thereby making it possible to complete a semiconductor integrated circuit device according to a wafer process and realize high-density packaging on a printed circuit board.

(14) An advantageous effect is obtained in that the first and second electrodes are respectively formed as bonding pads, so that a semiconductor chip related thereto can be built into a semiconductor integrated circuit device having lead terminals, thus making it possible to implement diversified package forms of semiconductor chips.

(15) An advantageous effect is obtained in that the areas of the first and second external connecting electrodes are set larger than those of the first and second electrodes in addition to the above, whereby external connecting means such as bump electrodes, etc. can be obtained while bringing the elements and wirings or the like formed on the semiconductor substrate into high integration.

(16) An advantageous effect is obtained in that in addition to the above, solder balls are provided for the first and second external connecting electrodes to thereby enable the manufacture thereof in a wafer process, whereby the packaging of a semiconductor integrated circuit device can be carried out simply and stably.

(17) An advantageous effect is obtained in that in addition to the above, first external connecting electrodes are further provided on the organic insulating film, the conductive layer is connected to each of the first external connecting electrodes, and external connecting electrodes other than the first external connecting electrodes are disconnected therefrom, thereby making it possible to effectively supply a voltage or signal to each circuit element formed on the semiconductor substrate by use of one external terminal.

(18) An advantageous effect is obtained in that a clock signal is supplied to the first external connecting electrodes in addition to the above, thereby making it possible to reduce skews of clocks supplied to plural circuits formed on a semiconductor substrate and speed up each circuit.

(19) An advantageous effect is obtained in that in addition to the above, a voltage forming circuit responsive to a first voltage is further provided on the one main surface of the semiconductor substrate, and the voltage forming circuit forms a second voltage different from the first voltage and transfers the second voltage through the conductive layer, whereby a power circuit formed on the semiconductor substrate can be simplified and laid out easily, and a uniform voltage can be supplied stably.

(20) An advantageous effect is obtained in that in addition to the above, a clock reproducing circuit responsive to a first clock is further provided on the one main surface of the semiconductor substrate, and the clock reproducing circuit outputs a second clock corresponding to the first clock and distributes it through the conductive layer, whereby an internal clock synchronized with a clock supplied from outside can be distributed to each circuit formed on the semiconductor substrate with efficiency.

(21) An advantageous effect is obtained in that in addition to the above, the conductive layers are connected via the wirings provided on the one main surface of the semiconductor substrate at parts thereof, whereby the conductive layers can be placed so as to intersect each other, and signal and source lines can easily be laid out.

(22) An advantageous effect is obtained in that in addition to the above, top-layer wirings formed on the one main surface of the semiconductor substrate and wirings formed therebelow are utilized in combination as the wirings for connecting the conductive layers to one another, whereby the layout of signal and source lines can be made easier.

(23) An advantageous effect is obtained in that circuit elements and wirings constituting each circuit, and first and second electrodes electrically connected to the circuit are provided on one main surface of a semiconductor substrate, an organic insulating film is formed on the circuit except for surface portions of the first and second electrodes, first and second external connecting electrodes are provided on the organic insulating film, conductive layers for respectively electrically connecting the first and second external connecting electrodes and the first and second electrodes are placed on the organic insulating film, and one of the conductive layers is connected to its corresponding wiring provided on the one main surface of the semiconductor substrate at a portion where they intersect, whereby the layout of signal and source lines can be facilitated.

(24) An advantageous effect is obtained in that in addition to the above, top-layer wirings formed on the one main surface of the semiconductor substrate and wirings formed therebelow are utilized in combination as the wirings for connecting the conductive layers to one another, whereby the layout of signal and source lines can be made easier.

While the invention made above by the present inventors has been described specifically based on the illustrated embodiments, the invention of the present application is not limited to the embodiments. It is needless to say that various changes can be made thereto within the scope not departing from the substance thereof. For example, the structure and material of each rewiring formed on the semiconductor chip can take various embodiments. The present invention can be applied to a type in which a plurality of semiconductor integrated circuit devices provided with the bump electrodes are placed on one printed circuit board to take a multi chip module configuration. Besides, the present invention can be applied even to a semiconductor integrated circuit device of such a multi chip package configuration that two semiconductor chips are assembled into a laminated structure to thereby form one semiconductor integrated circuit device.

INDUSTRIAL APPLICABILITY

The present invention is widely available to a semiconductor integrated circuit device formed up to a package in a wafer process.

What is claimed is:

1. A semiconductor integrated circuit device comprising:
   circuit elements and wirings which are provided on a main surface of a semiconductor substrate and constitute a semiconductor integrated circuit;
   a first insulating film provided over the circuit elements and the wirings;
   a first pad electrode and a second pad electrode provided over the first insulating film;
   a protective film provided over the circuit except for openings over surfaces of the first and second pad electrodes;
   a second insulating film provided over the protective film except for the openings; and
   a first conductive layer, for electrically connecting to a first external terminal, provided over the second insulating film and electrically connected to the first pad electrode and the second pad electrode.

2. The semiconductor integrated circuit device according to claim 1, further comprising:
   a second conductive layer, for electrically connecting to a second external terminal, provided over the second insulating film and electrically connected to a third pad electrode,
   wherein a width of the first conductive layer is greater than a width of the second conductive layer.

3. The semiconductor integrated circuit device according to claim 2,
   wherein the first conductive layer serves for electrically connecting to a third external terminal different from the first external terminal.

4. The semiconductor integrated circuit device according to claim 1,
   wherein the first conductive layer serves for electrically connecting to a second external terminal different from the first external terminal.

5. The semiconductor integrated circuit device according to claim 1, wherein a width of the first conductive layer is greater than a width of the first external terminal.

6. The semiconductor integrated circuit device according to claim 1, wherein first external terminal is a bump electrode.

7. The semiconductor integrated circuit device according to claim 1, wherein the first pad electrode and the second pad electrode are respectively bonding pads.

8. The semiconductor integrated circuit device according to claim 1, wherein the protective film includes a silicon nitride film, wherein the second insulating film includes a polyimide film.

9. The semiconductor integrated circuit device according to claim 1, wherein a thickness of the first conductive layer being greater than a thickness of the first pad electrode and the second pad electrode.

10. A semiconductor integrated circuit device comprising:
circuit elements and wirings which are provided on a main surface of a semiconductor substrate and constitute a semiconductor integrated circuit;
a first insulating film provided over the circuit elements and the wirings;
a first pad electrode and a second pad electrode provided over the first insulating film;
a protective film provided over the circuit except for openings over surfaces of the first and second pad electrodes; and
a first conductive layer, for electrically connecting to a first external terminal, provided over the protective film and electrically connected to the first pad electrode and the second pad electrode.

11. The semiconductor integrated circuit device according to claim 10, further comprising:
a second conductive layer, for electrically connecting to a second external terminal, provided over the protective film and electrically connected to a third pad electrode, wherein a width of the first conductive layer is greater than a width of the second conductive layer.

12. The semiconductor integrated circuit device according to claim 11, wherein the first conductive layer serves for electrically connecting to a third external terminal different from the first external terminal.

13. The semiconductor integrated circuit device according to claim 10, wherein the first conductive layer serves for electrically connecting to a second external terminal different from the first external terminal.

14. The semiconductor integrated circuit device according to claim 10, wherein a width of the first conductive layer is greater than a width of the first external terminal.

15. The semiconductor integrated circuit device according to claim 10, wherein first external terminal is a bump electrode.

16. The semiconductor integrated circuit device according to claim 10, wherein the first pad electrode and the second pad electrode are respectively bonding pads.

17. The semiconductor integrated circuit device according to claim 10, wherein the protective film includes a silicon nitride film.

18. The semiconductor integrated circuit device according to claim 10, wherein a thickness of the first conductive layer being greater than a thickness of the first pad electrode and the second pad electrode.

* * * * *